(12) United States Patent
Bang et al.

(10) Patent No.: US 11,706,945 B2
(45) Date of Patent: Jul. 18, 2023

(54) DISPLAY APPARATUS COMPRISNG A PARTITION WALL ON AN ORGANIC INSULATING LAYER AND METHOD OF MANUFACTURING THE SAME

(71) Applicant: Samsung Display Co., Ltd., Yongin-si (KR)

(72) Inventors: Kiho Bang, Yongin-si (KR); Eunae Jung, Yongin-si (KR); Wonsuk Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/120,765

(22) Filed: Dec. 14, 2020

(65) Prior Publication Data

US 2021/0336214 A1    Oct. 28, 2021

(30) Foreign Application Priority Data

Apr. 23, 2020    (KR) .......................... 10-2020-0049480

(51) Int. Cl.
*H01L 33/00* (2010.01)
*H10K 50/844* (2023.01)
(Continued)

(52) U.S. Cl.
CPC .......... *H10K 50/844* (2023.02); *H10K 50/15* (2023.02); *H10K 50/16* (2023.02); *H10K 50/82* (2023.02);
(Continued)

(58) Field of Classification Search
CPC ............. H01L 51/5253; H01L 27/3246; H01L 27/3258; H01L 27/3276; H01L 51/5056;
(Continued)

(56) References Cited

U.S. PATENT DOCUMENTS 9,000,428 B2    4/2015  Lee et al.
10,396,311 B2   8/2019  Lee et al.
(Continued)

FOREIGN PATENT DOCUMENTS

KR    10-2014-0133053 A    11/2014
KR    10-2019-0027003 A     3/2019
(Continued)

*Primary Examiner* — Phuc T Dang
(74) *Attorney, Agent, or Firm* — Lewis Roca Rothgerber Christie LLP

(57) ABSTRACT

A display apparatus includes a substrate defining an opening area and including a display area and an intermediate area between the opening area and the display area; an inorganic insulating layer in the display area and the intermediate area; a pixel circuit in the display area; an organic insulating layer on the pixel circuit; a pixel electrode on the organic insulating layer, an intermediate layer on the pixel electrode, and an opposite electrode on the intermediate layer; a thin-film encapsulation layer on the opposite electrode and comprising a first inorganic encapsulation layer, a second inorganic encapsulation layer, and an organic encapsulation layer between the first and second inorganic encapsulation layer; and a partition wall on the organic insulating layer and including at least two dams, wherein the inorganic insulating layer is in contact with the thin-film encapsulation layer in an area between the partition wall and the opening area.

29 Claims, 26 Drawing Sheets

(51) Int. Cl.
*H10K 50/15* (2023.01)
*H10K 50/16* (2023.01)
*H10K 50/82* (2023.01)
*H10K 59/122* (2023.01)
*H10K 59/124* (2023.01)
*H10K 71/00* (2023.01)
*H10K 59/131* (2023.01)
*H10K 59/12* (2023.01)

(52) U.S. Cl.
CPC ......... *H10K 59/122* (2023.02); *H10K 59/124* (2023.02); *H10K 71/00* (2023.02); *H10K 59/1201* (2023.02); *H10K 59/131* (2023.02)

(58) Field of Classification Search
CPC .... H01L 51/5221; H10K 50/15; H10K 50/16; H10K 50/82; H10K 50/844; H10K 59/124; H10K 59/131; H10K 71/00; H10K 50/1201; H01K 59/122
USPC .......................................................... 257/88
See application file for complete search history.

(56) References Cited

U.S. PATENT DOCUMENTS

2017/0288004 A1* 10/2017 Kim .................... H01L 27/3258
2019/0341439 A1 11/2019 Choi et al.
2020/0212357 A1* 7/2020 Lim .................... H01L 51/0096

FOREIGN PATENT DOCUMENTS

KR 10-2019-0073695 A 6/2019
KR 10-2019-0128030 A 11/2019

* cited by examiner

DISPLAY APPARATUS COMPRISNG A PARTITION WALL ON AN ORGANIC INSULATING LAYER AND METHOD OF MANUFACTURING THE SAME

CROSS-REFERENCE TO RELATED APPLICATION

This application claims priority to and the benefit of Korean Patent Application No. 10-2020-0049480, filed on Apr. 23, 2020, in the Korean Intellectual Property Office, the entire content of which is incorporated herein by reference.

BACKGROUND

1. Field

One or more embodiments relate to a display apparatus and a method of manufacturing the same, and more particularly, to a display apparatus including a first area inside a display area, and a method of manufacturing the same.

2. Description of Related Art

Recently, the uses of display apparatuses have been diversified. Furthermore, as the thickness and the weight of display apparatuses decrease, the uses thereof have increased.

Among display apparatuses, various functions to be applied or linked to the display apparatuses are being added while the area occupied by a display area is increased. In order to add various functions while increasing the area, research has been conducted into display apparatuses in which various elements may be arranged in a display area.

SUMMARY

One or more embodiments provide a display apparatus including a first area in which various types of elements may be arranged in a display area, and a method of manufacturing the same. However, it should be understood that embodiments described herein should be considered in a descriptive sense only and not for limitation of the embodiments.

Additional aspects will be set forth in part in the description which follows and, in part, will be apparent from the description, or may be learned by practice of the presented embodiments.

According to one or more embodiments, a display apparatus includes a substrate defining an opening area and including a display area and an intermediate area between the opening area and the display area, an inorganic insulating layer in the display area and the intermediate area, a pixel circuit on the display area, an organic insulating layer on the pixel circuit, a pixel electrode on the organic insulating layer and electrically connected to the pixel circuit, an intermediate layer on the pixel electrode, and an opposite electrode on the intermediate layer, a thin-film encapsulation layer on the opposite electrode and including a first inorganic encapsulation layer, a second inorganic encapsulation layer, and an organic encapsulation layer between the first inorganic encapsulation layer and the second inorganic encapsulation layer, and a partition wall on the organic insulating layer in the intermediate area and including at least two dams, wherein the inorganic insulating layer is in contact with the thin-film encapsulation layer in an area between the partition wall and the opening area.

The intermediate layer and the opposite electrode may extend to the intermediate area and cover the partition wall, and may include a cut surface in the intermediate area.

The intermediate layer and the opposite electrode may end at the area between the partition wall and the opening area.

An end portion of the intermediate layer may correspond to an end portion of the opposite electrode.

The display apparatus may further include a metal residual layer on the inorganic insulating layer corresponding to the area between the partition wall and the opening area.

The first inorganic encapsulation layer may be in contact with the metal residual layer in the area between the partition wall and the opening area.

The metal residual layer may expose at least a portion of the inorganic insulating layer.

The metal residual layer may include the same material as the pixel electrode.

The partition wall may include at least three dams arranged with a valley between each of the at least three dams, respectively.

Each of the at least three dams may include a first layer on the organic insulating layer and a second layer arranged on the first layer.

The display apparatus may further include a pixel-defining layer defining an opening that exposes a portion of the pixel electrode, and a spacer on the pixel-defining layer, wherein the first layer may include the same material as the pixel-defining layer, and the second layer may include the same material as the spacer.

The valley may expose at least a portion of the organic insulating layer.

The at least three dams may include a first dam closest to the display area, and the organic insulating layer on a side of the first dam adjacent the display area may define a groove portion.

A portion of the organic encapsulation layer may be in the groove portion.

The at least three dams may further include a second dam, and the intermediate layer and the opposite electrode may be arranged to cover the partition wall and may extend to a side surface of the second dam arranged toward a fourth area.

The display apparatus may further define an opening corresponding to the opening area and penetrating the substrate.

A pixel circuit layer may further include a routing wire bypassing the opening area.

The display apparatus may further include a component on one side of the substrate, corresponding to the opening area.

According to one or more embodiments, a display apparatus includes a substrate defining an opening area and comprising a display area and an intermediate area between the opening area and the display area, an inorganic insulating layer in the display area and the intermediate area, a pixel circuit on the inorganic insulating layer in the display area, an organic insulating layer on the pixel circuit, a pixel electrode on the organic insulating layer and electrically connected to the pixel circuit, an intermediate layer on the pixel electrode, and an opposite electrode on the intermediate layer, a thin-film encapsulation layer on the opposite electrode and including a first inorganic encapsulation layer, a second inorganic encapsulation layer, and an organic encapsulation layer between the first inorganic encapsulation layer and the second inorganic encapsulation layer, at least two partition walls on the organic insulating layer in the intermediate area, and a dam portion on the inorganic insulating layer in the intermediate area between the partition wall and the opening area.

The display apparatus may further include a metal residual layer in the intermediate area in an area between the dam portion and the opening area.

The intermediate layer and the opposite electrode may end in the area between the dam portion and the opening area.

The intermediate layer and the opposite electrode may extend to the dam portion and cover a top surface of the dam portion.

The first inorganic encapsulation layer may be in contact with the metal residual layer in the intermediate area in the area between the dam portion and the opening area.

According to one or more embodiments, a method of manufacturing a display apparatus includes preparing a substrate defining an opening area and comprising a display area and an intermediate area between the opening area and the display area, forming an inorganic insulating layer on the display area and the intermediate area, forming a pixel circuit on the inorganic insulating layer in the display area, forming an organic insulating layer on the pixel circuit, forming a partition wall including at least two dams on the organic insulating layer in the intermediate area, sequentially forming, on the organic insulating layer, a pixel electrode, an intermediate layer, and an opposite electrode which are electrically connected to the pixel circuit, irradiating with a laser the opposite electrode and the intermediate layer which are formed in the intermediate area between the opening area and the partition wall, and forming, on the opposite electrode, a thin-film encapsulation layer in which a first inorganic encapsulation layer, an organic encapsulation layer, and a second inorganic encapsulation layer are sequentially formed, wherein the first inorganic encapsulation layer is in contact with the inorganic insulating layer in the intermediate area between the opening area and the partition wall.

The method may further include, before irradiating with the laser, forming a metal layer on the inorganic insulating layer in the intermediate area between the opening area and the partition wall.

The step of irradiating with the laser may include removing the intermediate layer and the opposite electrode formed on the metal layer with the laser.

The first inorganic encapsulation layer may be connected to the inorganic insulating layer in the intermediate area between the opening area and the partition wall.

After irradiating with the laser, a portion of the metal layer may be removed together with the intermediate layer and the opposite electrode, and a remaining portion of the metal layer may remain as a metal residual layer.

The metal residual layer may expose a portion of the inorganic insulating layer located therebelow in the intermediate area between the opening area and the partition wall, and the first inorganic encapsulation layer may be in contact with the metal residual layer and the portion of the inorganic insulating layer exposed by the metal residual layer.

In forming the partition wall, the partition wall may include at least three dams with a valley between each of the at least three dams, respectively, and the first inorganic encapsulation layer may be in contact with the second inorganic encapsulation layer on at least one of the at least three dams.

These and/or other aspects will become apparent and more readily appreciated from the following description of the embodiments, the accompanying drawings, and the claims.

These general and specific aspects may be implemented using systems, methods, computer programs, or any combination of systems, methods, and/or computer programs.

BRIEF DESCRIPTION OF THE DRAWINGS

The above and other aspects and features of embodiments of the present disclosure will be more apparent from the following description taken in conjunction with the accompanying drawings, in which.

DETAILED DESCRIPTION

Figure 1:
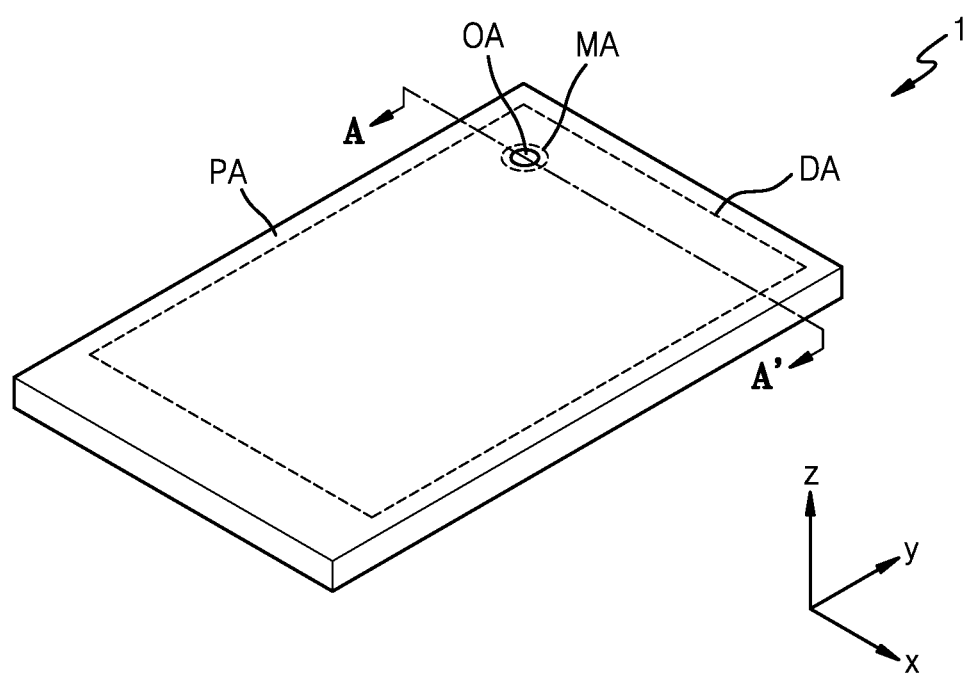
FIG. 1 is a schematic perspective view of a display apparatus according to an embodiment of the present disclosure.

Reference will now be made in detail to embodiments, examples of which are illustrated in the accompanying drawings, wherein like reference numerals refer to like elements throughout. In this regard, the present embodiments may be embodied in different forms and should not be construed as being limited to the descriptions set forth herein. Rather, the embodiments are described below as examples, by referring to the figures, to explain aspects of the present description. As such, processes, elements, and techniques that are not necessary to those having ordinary skill in the art for a complete understanding of the aspects and features of the present invention may not be described.

As used herein, the term "and/or" includes any and all combinations of one or more of the associated listed items. Throughout the specification, the expression "at least one of a, b or c" indicates only a, only b, only c, both a and b, both a and c, both b and c, all of a, b, and c, or variations thereof.

Various modifications may be applied to the present embodiments, and particular embodiments will be illustrated in the drawings and described in the detailed description section. The effects and features of the present embodiments, and a method to achieve the same will be clearer referring to the detailed descriptions below with the drawings. However, the present embodiments may be implemented in various forms, not by being limited to the embodiments presented below.

The present specification will now be described more fully with reference to the accompanying drawings. Those elements that are the same or are in correspondence are rendered the same reference numeral regardless of the figure number, and redundant explanations may be omitted.

In the present specification, although the terms "first," "second," etc. may be used herein to describe various elements, these elements should not be limited by these terms. These elements are only used to distinguish one element from another.

In the present specification, the singular forms "a," "an," and "the" are intended to include the plural forms as well, unless the context clearly indicates otherwise.

In the present specification, the terms "includes," "including," "comprises" and/or "comprising" used herein specify the presence of stated features or elements, but do not preclude the presence or addition of one or more other features or elements.

In the present specification, when a layer, region, or element is referred to as being "formed on," another layer, region, or element, it can be directly or indirectly formed on the other layer, region, or element. That is, for example, intervening layers, regions, or elements may be present.

In the present specification, when a layer, region, or element is referred to as being connected to another layer, region, or element, it can be directly connected to the other layer, region, or element or indirectly connected to the other layer, region, or element via intervening layers, regions, or elements. For example, in the present specification, when a layer, region, or element is referred to as being electrically connected to another layer, region, or element, it can be directly electrically connected to the other layer, region, or element or indirectly electrically connected to the other layer, region, or element via intervening layers, regions, or elements.

In the present specification, an expression such as "A and/or B" may include A, B, or A and B. The expression such as "at least one of A and B" may include A, B, or A and B.

In the present specification, the x-axis, the y-axis, and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

In the present specification, when a certain embodiment may be implemented differently, a specific process order may be performed differently from the described order. For example, two consecutively described processes may be performed substantially at the same time or performed in an order opposite to the described order.

Sizes of elements in the drawings may be exaggerated or reduced for convenience of explanation. In other words, since sizes and thicknesses of elements in the drawings may be arbitrarily illustrated for convenience of explanation, the following embodiments are not limited thereto.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

In addition, it will also be understood that when an element or layer is referred to as being "between" two elements or layers, it can be the only element or layer between the two elements or layers, or one or more intervening elements or layers may also be present.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a schematic perspective view of a display apparatus 1 according to an embodiment of the present disclosure.

Figure 2:
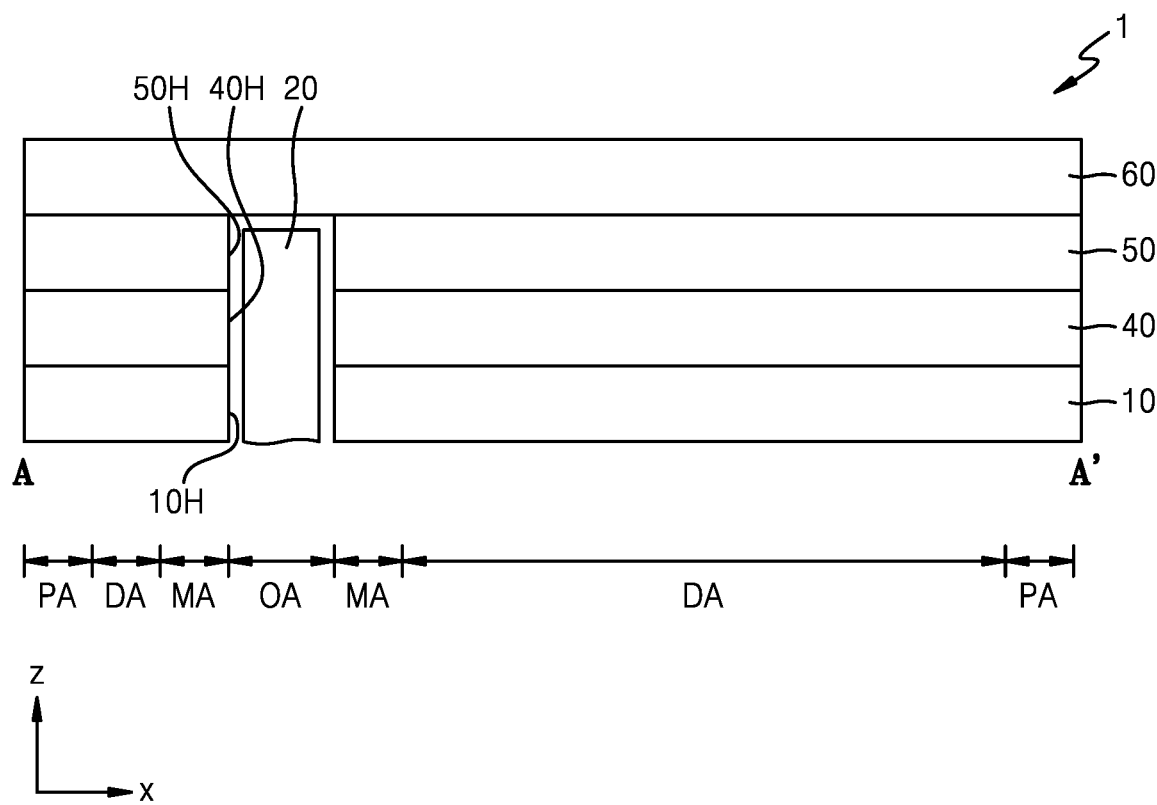
FIGS. 2 and 3 are schematic cross-sectional views of a display apparatus taken along line A-A' of FIG. 1, according to embodiments of the present disclosure.

Referring to FIG. 1, the display apparatus 1 may include a first area OA that is an opening area (or transmission area) and a display area DA that is a second area at least partially surrounding the first area OA. The display apparatus 1 may provide a certain image by using light emitted from a plurality of pixels arranged in the display area DA. The first area OA may be entirely surrounded by the display area DA. The first area OA may be an area in which a component to be described later with reference to FIG. 2 is arranged.

An intermediate area MA including a third area MA1 (see, e.g., FIG. 7) and a fourth area MA2 (see, e.g., FIG. 7) may be between the first area OA and the display area DA that is the second area, and the display area DA may be surrounded by a peripheral area PA that is a fifth area. The intermediate area MA and the peripheral area PA may each be a type of non-display area in which pixels are not arranged. The intermediate area MA may be entirely surrounded by the display area DA, and the display area DA may be entirely surrounded by the peripheral area PA.

Although the display apparatus 1 is described in the below example as an organic light-emitting display apparatus, the display apparatus 1 is not limited thereto. In another embodiment, the display apparatus 1 according to an embodiment may be a display apparatus such as a quantum dot light-emitting display apparatus. For example, an emission layer of a display element provided in the display apparatus 1 may include an organic material, an inorganic material, quantum dots, an organic material and quantum dots, or an inorganic material and quantum dots.

Though it is shown in FIG. 1 that one first area OA is provided and has a substantially circular shape, the embodiment is not limited thereto. The first area OA may be provided as two or more first areas OA, and the shape of each first area OA may be variously changed, such as by being circular, elliptical, polygonal, star, and/or diamond shapes.

Figure 3:
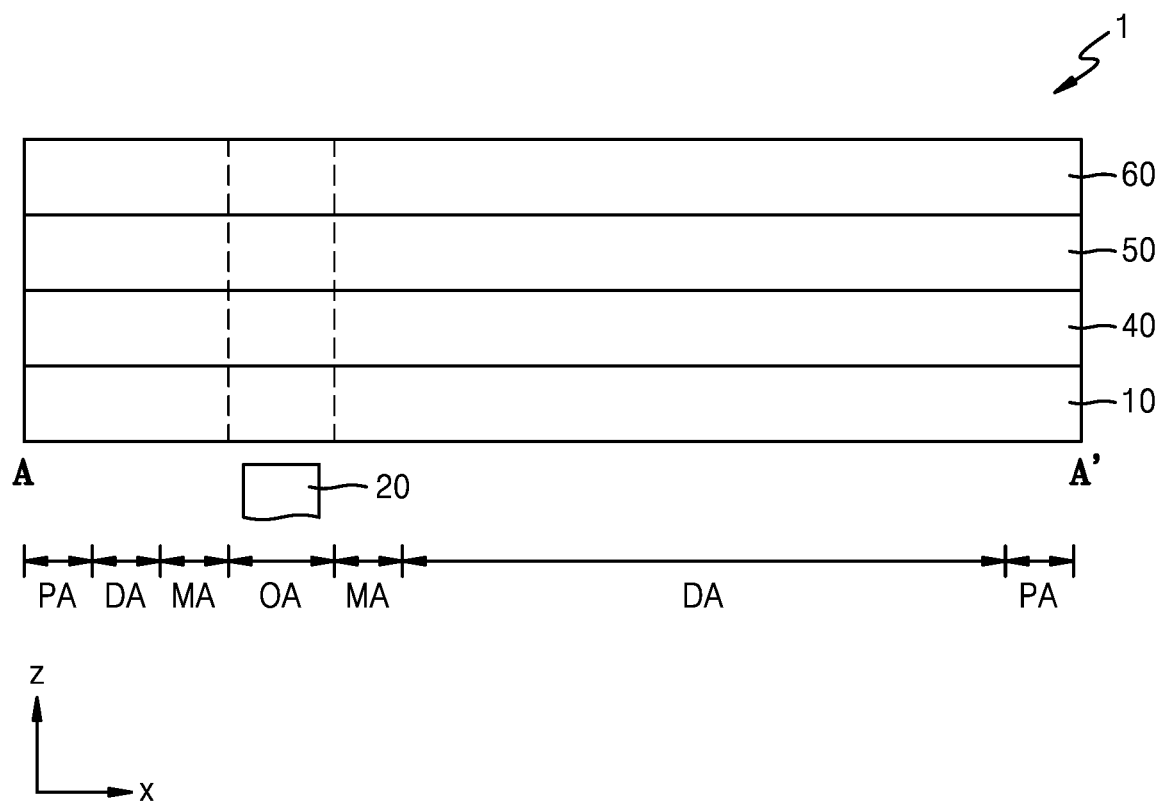

FIGS. 2 and 3 are schematic cross-sectional views of the display apparatus 1 taken along a line A-A' of FIG. 1, according to embodiments of the present disclosure.

Referring to FIG. 2, the display apparatus 1 may include a display panel 10, an input sensing layer 40 arranged on the display panel 10, and an optical functional layer 50, and these elements may be covered by a window 60. The display apparatus 1 may be used in various types of electronic devices, such as mobile phones, notebook computers, and smartwatches.

The display panel 10 may display an image. The display panel 10 may include pixels arranged in the display area DA. Each of the pixels may include a display element and a pixel circuit connected to the display element. The display element may include an organic light-emitting diode or a quantum dot organic light-emitting diode.

The input sensing layer 40 may obtain coordinate information according to an external input, for example, a touch event. The input sensing layer 40 may include a sensing electrode (or a touch electrode) and trace lines connected to the sensing electrode. The input sensing layer 40 may be arranged on the display panel 10. The input sensing layer 40 may sense an external input by using a mutual-cap method and/or a self-cap method.

The input sensing layer 40 may be directly formed on the display panel 10 or separately formed and then combined with the display panel 10 by using an adhesive layer such as an optical clear adhesive. For example, the input sensing layer 40 may be continuously formed after a process of forming the display panel 10, and in this case, the input sensing layer 40 may be understood as a portion of the display panel 10, and the adhesive layer may not be between the input sensing layer 40 and the display panel 10. Though it is shown in FIG. 2 that the input sensing layer 40 is between the display panel 10 and the optical functional layer 50, in another embodiment, the input sensing layer 40 may be arranged on the optical functional layer 50.

The optical functional layer 50 may include a reflection prevention layer. The reflection prevention layer may reduce the reflectance of light (external light) incident from the outside toward the display panel 10 through the window 60. The reflection prevention layer may include a retarder and a polarizer. The retarder may include a film-type retarder or a liquid crystal-type retarder. The retarder may include a $\lambda/2$ retarder and/or a $\lambda/4$ retarder. The polarizer may also include a film-type polarizer or a liquid crystal-type polarizer. The film-type polarizer may include a stretchable synthetic resin film, and the liquid crystal-type polarizer may include liquid crystals arranged in a certain arrangement. Each of the retarder and the polarizer may further include a protective film. The retarder and the polarizer themselves or the protective film may be defined as a base layer of the reflection prevention layer.

In another embodiment, the reflection prevention layer may include a black matrix and color filters. The color filters may be arranged considering a color of light emitted from each of the pixels of the display panel 10. In addition, in another embodiment, the reflection prevention layer may include a destructive interference structure. The destructive interference structure may include a first reflection layer and a second reflection layer on different layers. First light and second light respectively reflected from the first reflection layer and the second reflection layer may destructively interfere with each other, and thus, the external light reflectance may be reduced.

The optical functional layer 50 may include a lens layer. The lens layer may improve a light output efficiency of light emitted from the display panel 10 or may reduce a variation in colors. The lens layer may include a layer having a concave or convex lens shape and/or may include a plurality of layers having different refractive indices. The optical functional layer 50 may include both or either of the aforementioned reflection prevention layer and lens layer.

In an embodiment, the optical functional layer 50 may be continuously formed after a process of forming the display panel 10 and/or the input sensing layer 40. In this case, the adhesive layer may not be between the optical functional layer 50 and the display panel 10 and/or between the optical functional layer 50 and the input sensing layer 40.

Each of the display panel 10, the input sensing layer 40, and/or the optical functional layer 50 may include an opening. In this regard, it is shown in FIG. 2 that the display panel 10, the input sensing layer 40, and the optical functional layer 50 include first to third openings 10H, 40H, and 50H, respectively, and the first to third openings 10H, 40H, and 50H overlap each other. The first to third openings 10H, 40H, and 50H may be located to correspond to the first area OA. In another embodiment, one or more of the display panel 10, the input sensing layer 40, and the optical functional layer 50 may not include an opening. For example, any one or two elements selected from among the display panel 10, the input sensing layer 40, and the optical functional layer 50 may not include an opening. Alternatively, the display panel 10, the input sensing layer 40, and the optical functional layer 50 may not include an opening as shown in FIG. 3.

As described above, the first area OA may be a type of component area (i.e., a sensor area, a camera area, a speaker area, etc.) in which a component 20 to add various functions to the display apparatus 1 is located. The component 20 may be in the first to third openings 10H, 40H, and 50H as shown in FIG. 2. Alternatively, the component 20 may be arranged below the display panel 10 as shown in FIG. 3. Alternatively, the display apparatus 1 includes the first to third openings 10H, 40H, and 50H in a similar manner to FIG. 2, and the component 20 may be arranged below the display panel 10 as shown in FIG. 3 rather than being in the first to third openings 10H, 40H, and 50H.

The component 20 may include an electronic element. For example, the component 20 may be an electronic element using light or sound. For example, the electronic element may be a sensor that outputs and/or receives light, such as an infrared sensor, a camera that captures an image by receiving light, a sensor that measures a distance or recognizes a fingerprint by outputting and sensing light or sound, a small lamp that outputs light, and/or a speaker that outputs sound. The electronic element using light may use light in various wavelength bands such as visible light, infrared light, ultraviolet light, etc. In some embodiments, the first area OA may be understood as a transmission area through which light and/or sound output from the component 20 to the outside or traveling toward the electronic element from the outside may be transmitted.

In another embodiment, when the display apparatus 1 is used as a smartwatch or an instrument panel for a vehicle, the component 20 may be a member such as clock hands or needles indicating certain information (e.g., vehicle speed, etc.). When the display apparatus 1 includes clock hands or an instrument panel for a vehicle, the component 20 may be exposed to the outside through the window 60, and the window 60 may include an opening corresponding to the first area OA.

The component 20 may include element(s) related to the functions of the display panel 10 as described above or may include elements such as accessories that improve the aesthetics of the display panel 10. In some embodiments, a layer including an optical clear adhesive or the like may be between the window 60 and the optical functional layer 50.

FIGS. 4A to 4D are schematic cross-sectional views of the display panel 10 according to embodiments of the present disclosure.

Figure 4A:
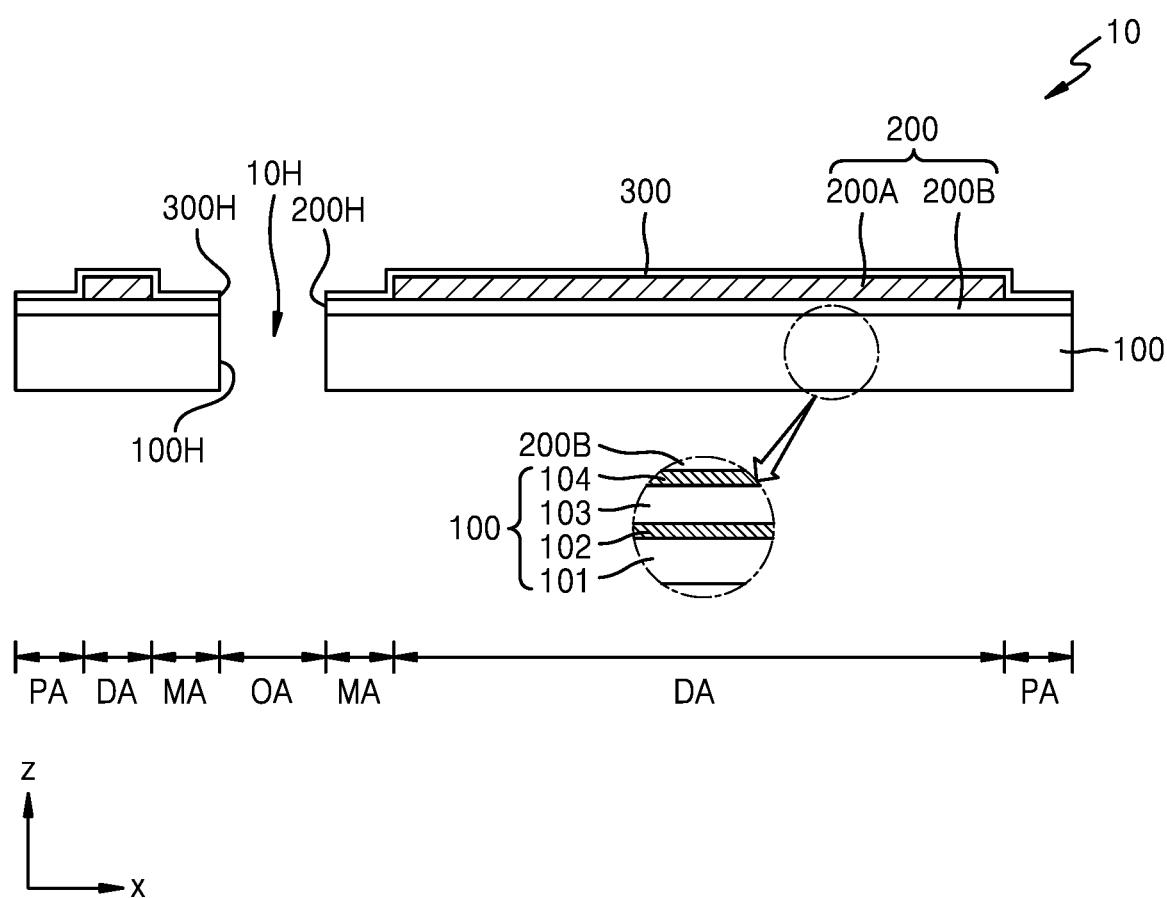
FIGS. 4A to 4D are schematic cross-sectional views of a display panel according to embodiments of the present disclosure.

Referring to FIG. 4A, the display panel 10 may include a display layer 200 arranged on a substrate 100. The substrate 100 may include a glass material or a polymer resin. The substrate 100 may include a multi-layer. For example, the substrate 100 may include a first base layer 101, a first barrier layer 102, a second base layer 103, and a second barrier layer 104, as shown in the enlarged portion of FIG. 4A.

Each of the first base layer 101 and the second base layer 103 may include a polymer resin. For example, each of the first base layer 101 and the second base layer 103 may include a polymer resin such as polyethersulfone, polyacrylate, polyetherimide, polyethylene naphthalate, polyethylene terephthalate, polyphenylene sulfide, polyarylate, polyimide, polycarbonate or cellulose acetate propionate. The aforementioned polymer resin may be transparent or translucent.

The first barrier layer 102 and the second barrier layer 104, which are barrier layers that reduce or prevent the penetration of external foreign substances, may include a single layer or a multi-layer including inorganic materials such as silicon nitride ($SiN_x$), silicon oxide ($SiO_x$), or silicon oxynitride ($SiO_xN_y$).

The display layer 200 may include a plurality of pixels. The display layer 200 may include a display element layer 200A and a pixel circuit layer 200B, the display element layer 200A including display elements arranged for each pixel, and the pixel circuit layer 200B including a pixel circuit and insulating layers arranged for each pixel. The display element layer 200A may include a pixel electrode, an opposite electrode, and a stacked structure therebetween, and each of the display elements may be an organic light-emitting diode (OLED). Each pixel circuit may include a thin-film transistor and a storage capacitor.

The display elements of the display layer 200 may be covered by an encapsulation member such as a thin-film encapsulation layer 300, and the thin-film encapsulation layer 300 may include at least one inorganic encapsulation layer and/or at least one organic encapsulation layer. When the display panel 10 includes a substrate 100 containing a polymer resin and a thin-film encapsulation layer 300 including an inorganic encapsulation layer and an organic encapsulation layer, the flexibility of the display panel 10 may be improved.

The display panel 10 may include a penetrating portion 10H penetrating the display panel 10. The penetrating portion 10H may be located in the first area OA, and in this case, the first area OA may be a type of opening (i.e., an opening area). In FIG. 4A, it is shown that the substrate 100 and the thin-film encapsulation layer 300 include through holes 100H and 300H, respectively, corresponding to the penetrating portion 10H of the display panel 10. The display layer 200 may also include a through hole 200H corresponding to the first area OA.

Figure 4B:
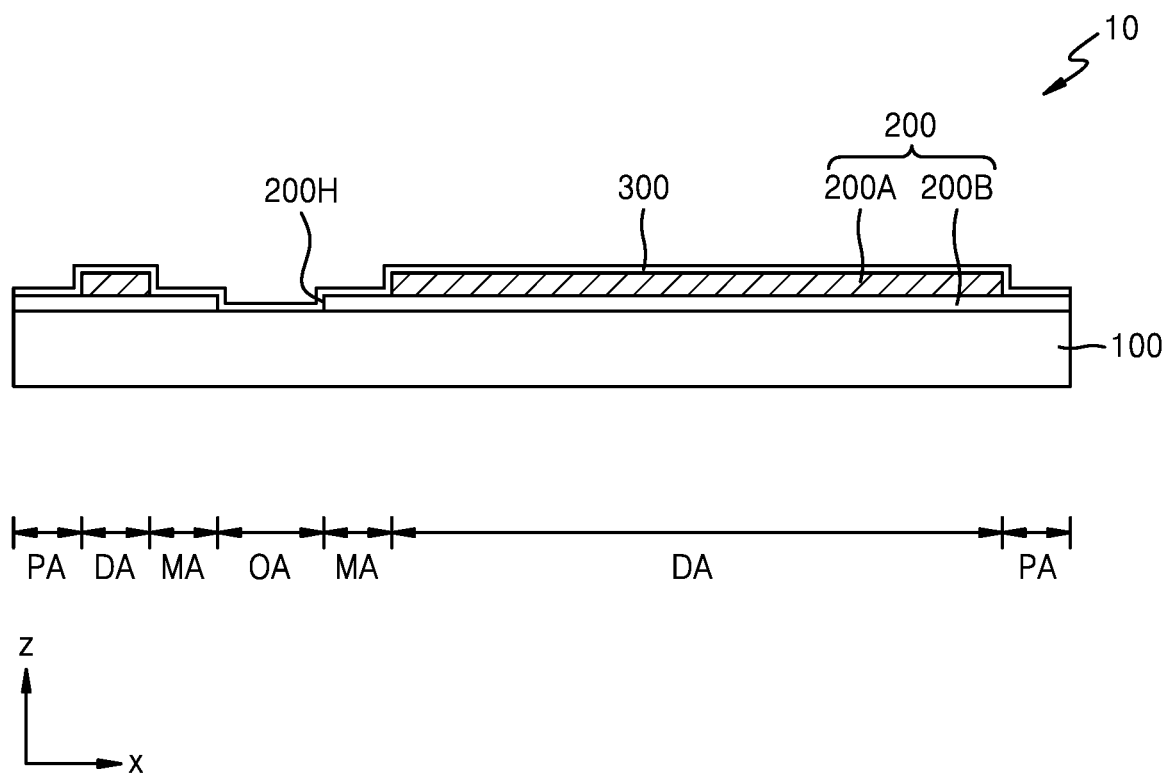

In another embodiment, as shown in FIG. 4B, the substrate 100 may not include a through hole corresponding to the first area OA. The display layer 200 may include the through hole 200H corresponding to the first area OA. The thin-film encapsulation layer 300 may not include a through hole corresponding to the first area OA. In another embodiment, as shown in FIG. 4C, the display layer 200 may not include a through hole corresponding to the first area OA.

Figure 4C:
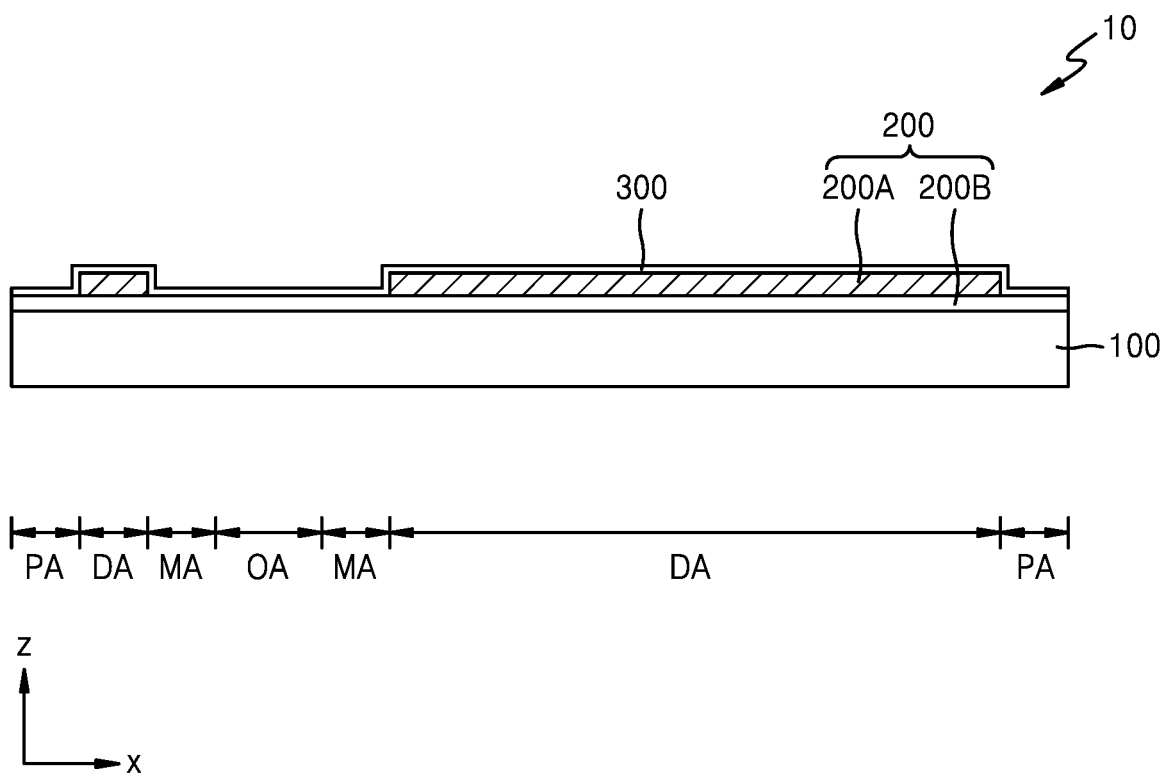
Figure 4D:
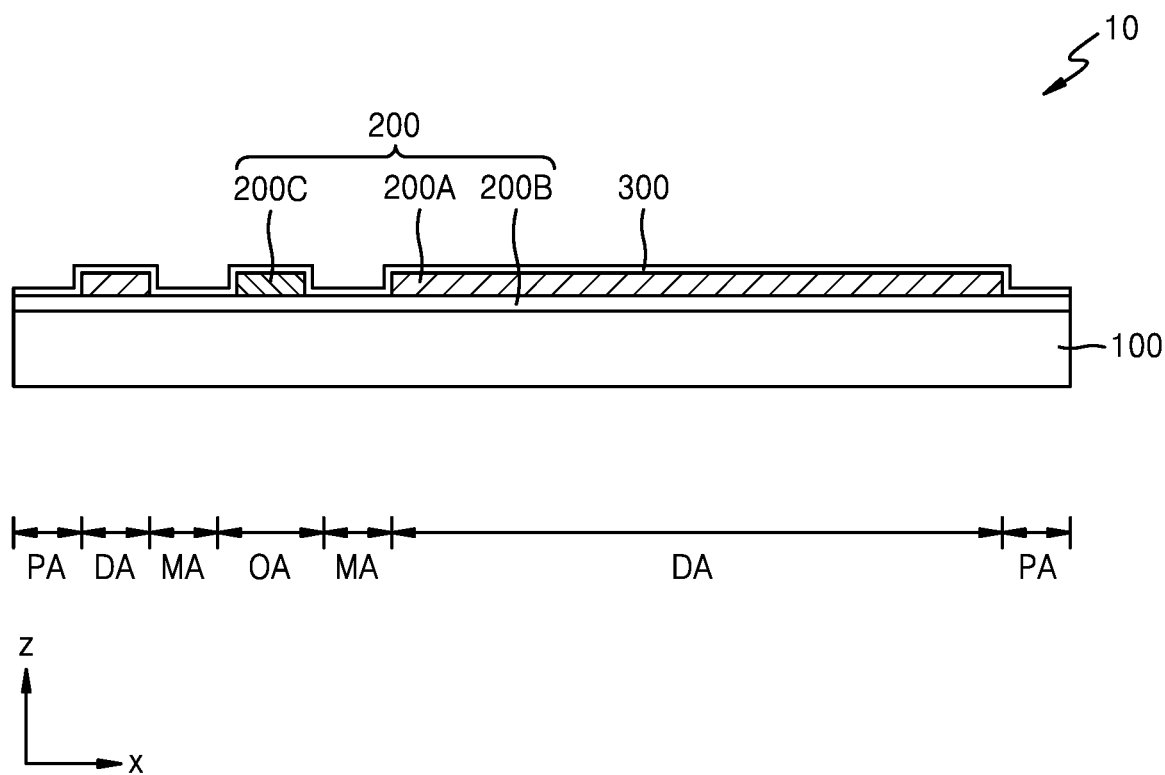

Though it is shown in FIGS. 4A to 4C that the display element layer 200A is not arranged in the first area OA, embodiments of the present disclosure are not limited thereto. In another embodiment, as shown in FIG. 4D, an auxiliary display element layer 200C may be located in the first area OA. The auxiliary display element layer 200C may include a display element that operates with a structure and/or in a method different from a structure and a method of a display element of the display element layer 200A.

In an embodiment, each pixel of the display element layer 200A may include an active organic light-emitting diode, and the auxiliary display element layer 200C may include pixels each including a passive organic light-emitting diode. When the auxiliary display element layer 200C includes a display element of the passive organic light-emitting diode, elements constituting a pixel circuit may not be present below the corresponding passive organic light-emitting diode. For example, a transistor and a storage capacitor are not included in a portion of the pixel circuit layer 200B below the auxiliary display element layer 200C.

In addition, in another embodiment, though the auxiliary display element layer 200C may include a display element of the same type (e.g., an active organic light-emitting diode) as the display element layer 200A, a pixel circuit therebelow may have a different structure. For example, the pixel circuit (e.g., a pixel circuit having a light-shielding layer between a substrate and a transistor, etc.) below the auxiliary display element layer 200C may have a structure different from a structure of a pixel circuit below the display element layer 200A. Alternatively, the display elements of the auxiliary display element layer 200C may operate according to a control signal different from a control signal by which the display elements of the display element layer 200A operate. A component (e.g., an infrared sensor, etc.) that does not require a relatively high transmittance may be arranged in the first area OA in which the auxiliary display element layer 200C is arranged. In this case, the first area OA may be both a component area and an auxiliary display area.

Figure 5:
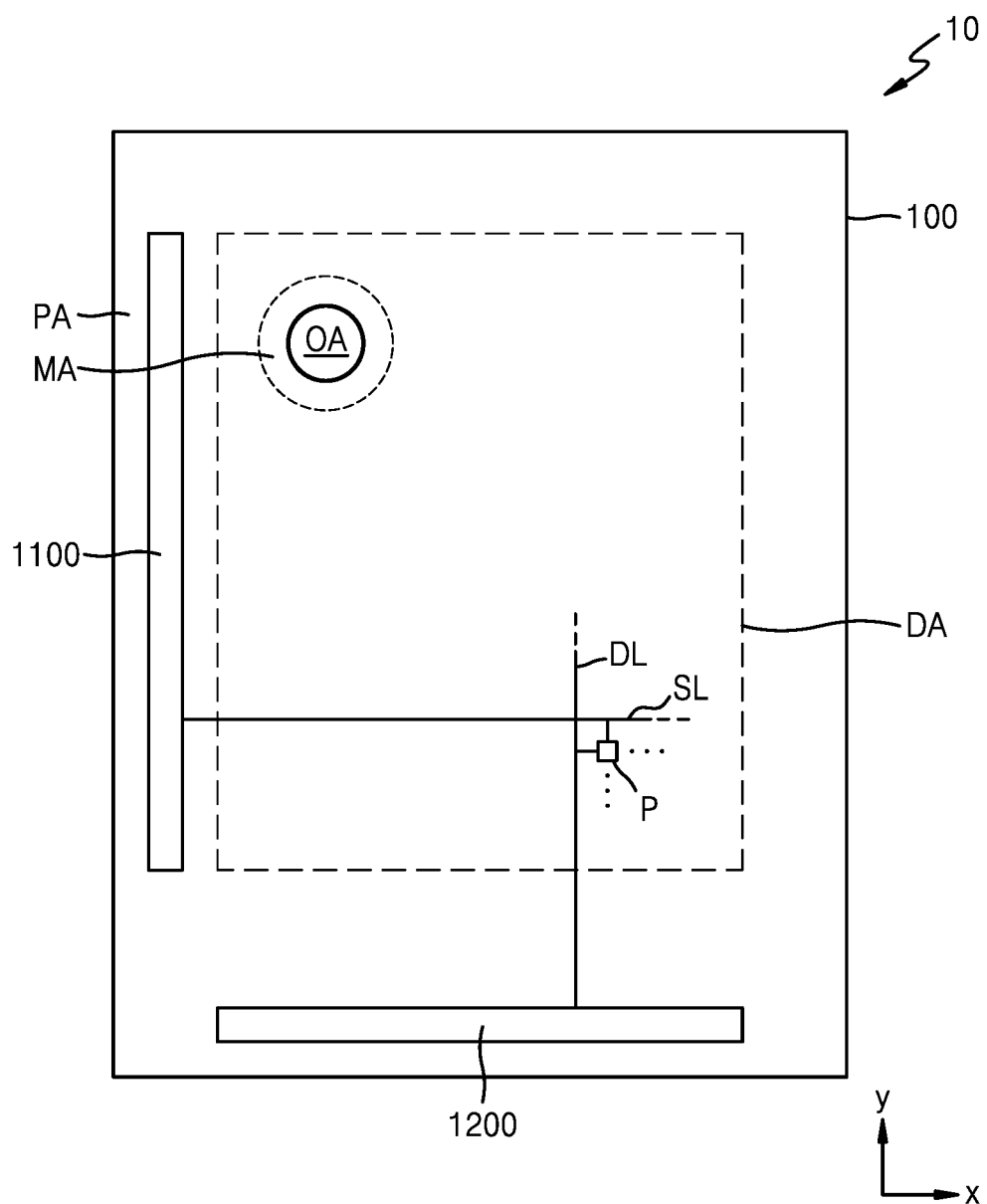
FIG. 5 is a schematic plan view of a display panel according to an embodiment of the present disclosure.
Figure 6:
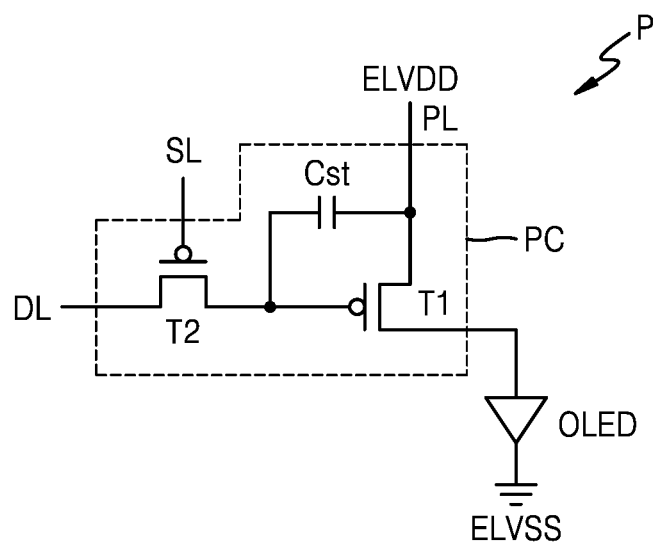
FIG. 6 is a schematic equivalent circuit diagram of one pixel of a display panel according to an embodiment of the present disclosure.

FIG. 5 is a schematic plan view of the display panel 10 according to an embodiment. FIG. 6 is a schematic equivalent circuit diagram of one pixel of the display panel 10 according to an embodiment.

Referring to FIG. 5, the display panel 10 may include a first area OA, a display area DA that is a second area, an intermediate area MA that is a third area and a fourth area, and a peripheral area PA that is a fifth area. In this embodiment, for example, the substrate 100 of the display panel 10 includes the first area OA, the display area DA, the intermediate area MA, and the peripheral area PA.

The display panel 10 may include a plurality of pixels P arranged in the display area DA. Each pixel P may include a pixel circuit PC and an organic light-emitting diode OLED as a display element connected to the pixel circuit PC, as shown in FIG. 6. The pixel circuit PC may include a first thin-film transistor T1, a second thin-film transistor T2, and a storage capacitor Cst. Each pixel P may emit, for example, red, green, blue, or white light through the organic light-emitting diode OLED.

The second thin-film transistor T2, which is a switching thin-film transistor, may be connected to a scan line SL and a data line DL and may be configured to transmit, to the first thin-film transistor T1, a data voltage input from the data line DL based on a switching voltage input from the scan line SL. The storage capacitor Cst may be connected to the second thin-film transistor T2 and a driving voltage line PL and may be configured to store a voltage corresponding to a difference between a voltage received from the second thin-film transistor T2 and a first power voltage ELVDD supplied from the driving voltage line PL.

The first thin-film transistor T1, which is a driving thin-film transistor, may be connected to the driving voltage line PL and the storage capacitor Cst and may be configured to control a driving current flowing through the organic light-emitting diode OLED from the driving voltage line PL in response to a voltage value stored in the storage capacitor Cst. The organic light-emitting diode OLED may emit light having a certain luminance according to the driving current. An opposite electrode (e.g., a cathode) of the organic light-emitting diode OLED may receive a second power voltage ELVSS.

Though it is shown in FIG. 6 that the pixel circuit PC includes two thin-film transistors and one storage capacitor, the embodiment is not limited thereto. The number of thin-film transistors and the number of storage capacitors may be variously changed according to the design of the pixel circuit PC. For example, the pixel circuit PC may further include three or more thin-film transistors in addition to the two thin-film transistors described above. In an embodiment, the pixel circuit PC may include seven thin-film transistors and one storage capacitor.

Referring back to FIG. 5, the intermediate area MA may surround the first area OA on a plane. The intermediate area MA is an area in which a display element such as an organic light-emitting diode emitting light is not arranged, and signal lines that provide signals to the pixels P arranged around the first area OA may pass through the intermediate area MA. In the peripheral area PA, a scan driver 1100 that provides a scan signal to each pixel P, a data driver 1200 that provides a data signal to each pixel P, and a main power wire that provides a first power voltage ELVDD and a second power voltage ELVSS may be arranged. Though it is shown in FIG. 5 that the data driver 1200 is arranged adjacent to one side of the substrate 100, in another embodiment, the data driver 1200 may be arranged on a flexible printed circuit board (FPCB) electrically connected to a pad arranged on one side of the display panel 10.

Figure 7:
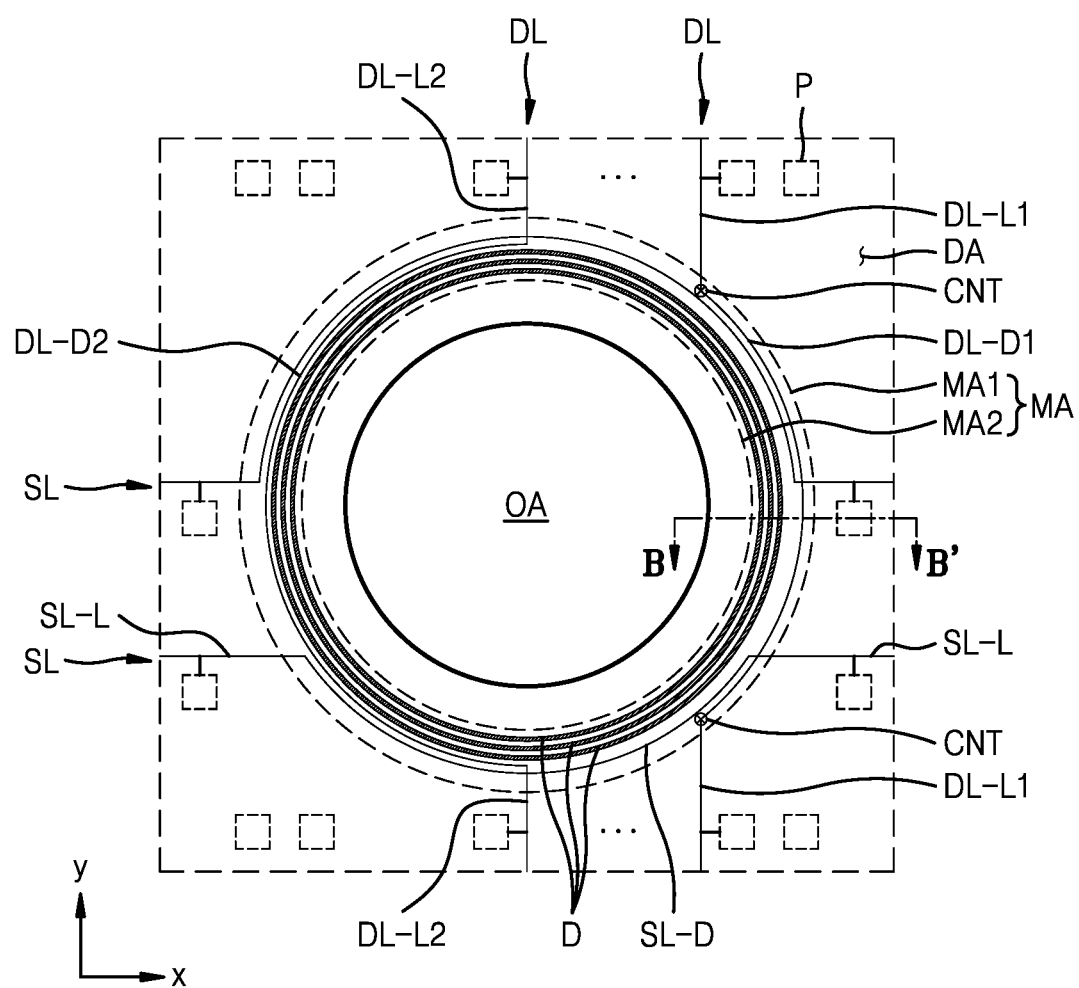
FIG. 7 is a plan view of a portion of a display panel according to an embodiment of the present disclosure.

FIG. 7 is a plan view of a portion of a display panel according to an embodiment.

Referring to FIG. 7, an intermediate area MA including a third area MA1 and a fourth area MA2 may be between a first area OA and a display area DA that is a second area. Unlike the display area DA, pixels P may not be arranged in the intermediate area MA. The third area MA1 may be an area of the intermediate area MA adjacent to the display area DA, and the fourth area MA2 may be an area of the intermediate area MA adjacent to the first area OA. On a plane, the fourth area MA2 may surround the first area OA, the third area MA1 may surround the fourth area MA2, and the display area DA may be arranged to surround the third area MA1.

The pixels P may be arranged around the first area OA in the display area DA. Some pixels P may be apart from each other around the first area OA, and the first area OA may be defined among the pixels P. For example, on a plane, the pixels P are arranged above and below the first area OA, respectively, and the pixels P may be arranged on left and right sides of the first area OA, respectively.

Signal lines SL adjacent to the first area OA among the signal lines SL that supply signals to the pixels P may bypass the first area OA. In this case, the signal lines SL bypassing the first area OA may be arranged on the third area MA1 adjacent to the display area DA and may not be arranged on the fourth area MA2.

On a plane of FIG. 7, at least one of data lines DL passing through the display area DA extends in a y-direction to provide data signals to the pixels arranged on and below the first area OA, respectively, and may bypass the first area OA in the intermediate area MA along edges of the first area OA. On a plane, at least one of scan lines SL passing through the display area DA extends in an x-direction to provide scan signals to the pixels P arranged on the left and right sides of the first area OA, respectively, and may bypass the first area OA in the intermediate area MA along the edges of the first area OA.

A circuitous portion (or bypass portion) SL-D of the scan line SL may be located on the same layer as an extension portion SL-L that crosses the display area DA, and may be formed as one body with the extension portion SL-L. A circuitous portion DL-D1 of at least one of the data lines DL may be formed on a different layer from an extension portion DL-L1 that crosses the display area DA, and the circuitous portion DL-D1 of the data line DL may be connected to the extension portion DL-L1 through a contact hole CNT. A circuitous portion DL-D2 of at least one of the data lines DL may be located on the same layer as an extension portion DL-L2 and may be formed as one body with the extension portion DL-L2.

At least two dams D may be located on the third area MA1 of the intermediate area MA. On a plane, the dams D may have a ring shape that surrounds the first area OA and may be arranged apart from each other.

Figure 8:
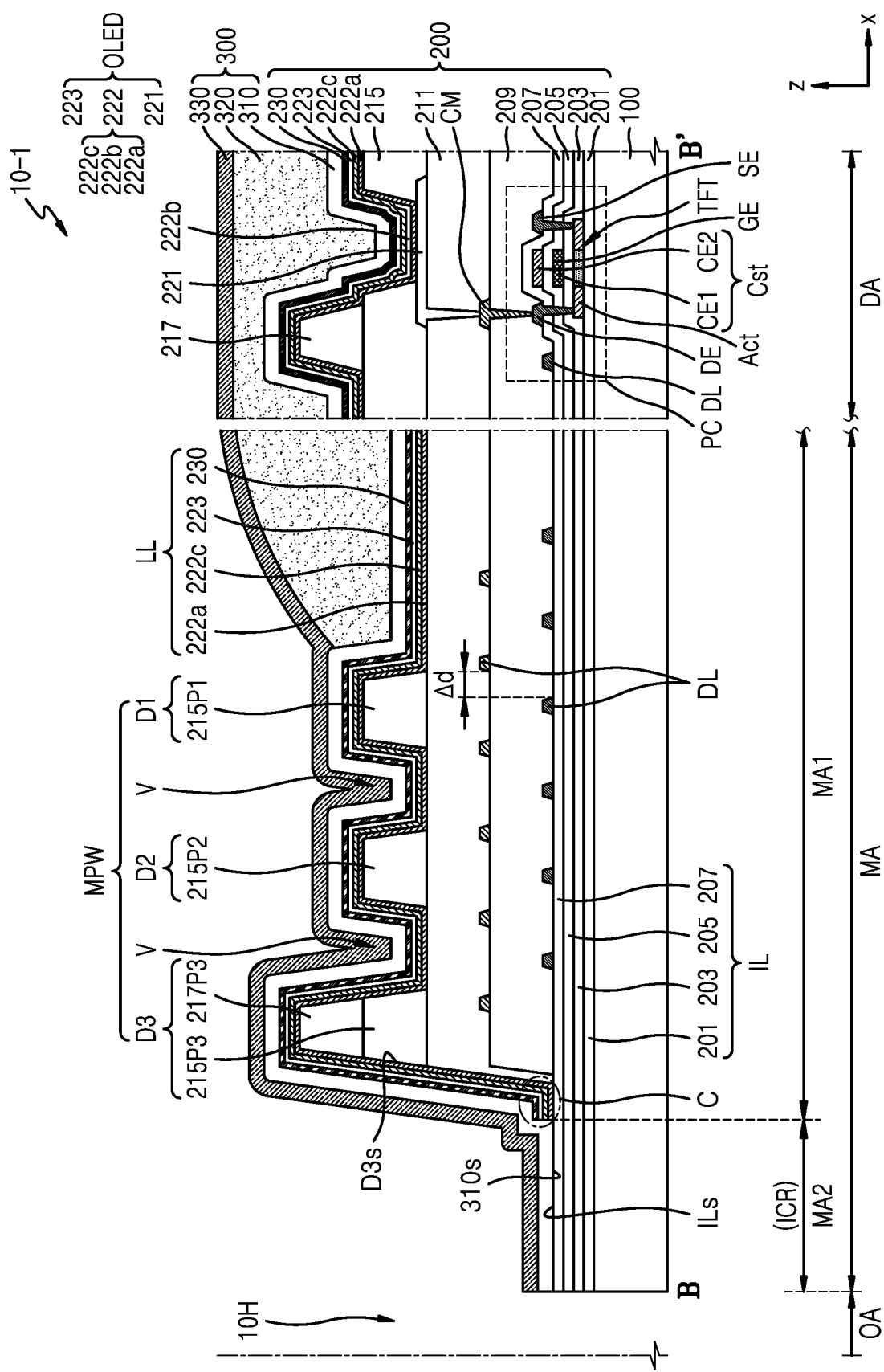
FIG. 8 is a cross-sectional view of a display panel according to an embodiment of the present disclosure.
Figure 9:
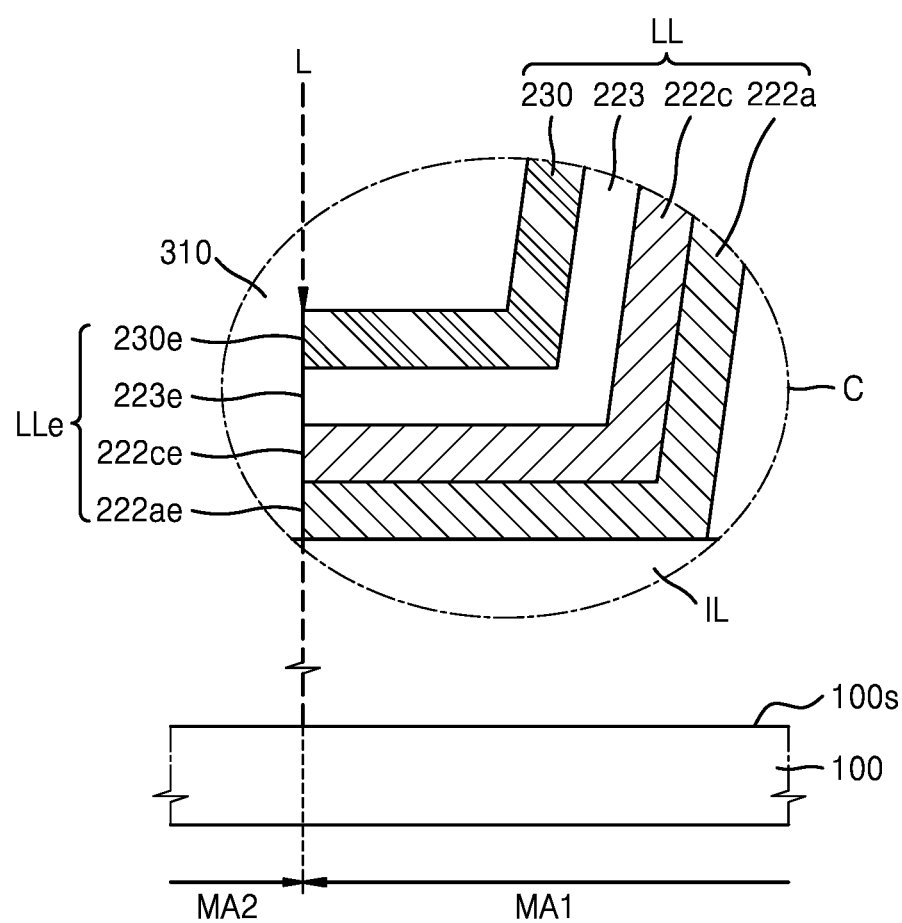
FIG. 9 is an enlarged view of a region C of FIG. 8.

FIG. 8 is a cross-sectional view of a display panel 10-1 according to an embodiment of the present disclosure. FIG. 9 is an enlarged view of a region C of FIG. 8. Display panels 10-2 and 10-3 of FIGS. 10 and 11, respectively, are modified examples of FIG. 8. FIG. 8 may correspond to a cross-section taken along a line B-B' of FIG. 7.

First, a cross-sectional structure of a display area DA will be described with reference to the display area DA of the display panel 10-1 of FIG. 8.

A substrate 100 may include a glass material and a polymer resin. In some embodiments, the substrate 100 may include a plurality of layers as shown, for example, in the enlarged view of FIG. 4A.

A buffer layer 201 may be formed on the substrate 100 to reduce or prevent the penetration of impurities into a semiconductor layer Act of a thin-film transistor TFT. The buffer layer 201 may include an inorganic insulating material such as silicon nitride, silicon oxynitride, and/or silicon oxide and may include a single layer or a multi-layer including any combination of the aforementioned inorganic insulating materials.

A pixel circuit PC may be arranged on the buffer layer 201. The pixel circuit PC may include the thin-film transistor TFT and a storage capacitor Cst. The thin-film transistor TFT may include the semiconductor layer Act, a gate electrode GE, and a source electrode SE and a drain electrode DE, which are connection electrodes. The thin-film transistor TFT shown in FIG. 8 may correspond to the first thin-film transistor T1, which is the driving thin-film transistor described with reference to FIG. 6. Though not shown in FIG. 8, the data line DL of the pixel circuit PC is electrically connected to the switching thin-film transistor (e.g., the second thin-film transistor T2 shown in FIG. 6) included in the pixel circuit PC. Though the present embodiment describes a top-gate type thin-film transistor in which the gate electrode GE is arranged above the semiconductor layer Act with a gate insulating layer 203 therebetween, in another embodiment, the thin-film transistor TFT may include a bottom-gate type thin-film transistor.

The semiconductor layer Act may include polysilicon. Alternatively, the semiconductor layer Act may include amorphous silicon, an oxide semiconductor, or an organic semiconductor. The gate electrode GE may include a low-resistance metal material. The gate electrode GE may include a conductive material including molybdenum (Mo), aluminum (Al), copper (Cu), and/or titanium (Ti) and may include a single layer or a multi-layer including any combination of the above materials.

The gate insulating layer 203 between the semiconductor layer Act and the gate electrode GE may include an inorganic insulating material such as silicon oxide, silicon nitride, silicon oxynitride, aluminum oxide, titanium oxide, tantalum oxide, and/or hafnium oxide. The gate insulating layer 203 may include a single layer or a multi-layer including any combination of the aforementioned materials.

The source electrode SE and the drain electrode DE, which are connection electrodes electrically connected to the semiconductor layer Act, may be located on the same layer as the data line DL and may include the same material as the data line DL. Each of the source electrode SE, the drain electrode DE, and the data line DL may include a material having excellent conductivity. The source electrode SE and the drain electrode DE may include a conductive material including Mo, Al, Cu, and/or Ti and may include a single layer or a multi-layer including any combination of the above materials. In some embodiments, the source electrode SE, the drain electrode DE, and the data line DL may include a multi-layer of Ti/Al/Ti.

The storage capacitor Cst may include a lower electrode CE1 and an upper electrode CE2 overlapping each other with a first interlayer insulating layer 205 therebetween. The storage capacitor Cst may overlap the thin-film transistor TFT. In this regard, it is shown in FIG. 8 that the gate electrode GE of the thin-film transistor TFT serves as the lower electrode CE1 of the storage capacitor Cst. In another embodiment, the storage capacitor Cst may not overlap the thin-film transistor TFT. The storage capacitor Cst may be covered by a second interlayer insulating layer 207. The upper electrode CE2 of the storage capacitor Cst may include a conductive material including Mo, Al, Cu, and/or Ti and include a single layer or a multi-layer including any combination of the above materials.

The first interlayer insulating layer 205 and the second interlayer insulating layer 207 each may include an inorganic insulating material such as silicon oxide, silicon nitride, silicon oxynitride, aluminum oxide, titanium oxide, tantalum oxide, hafnium oxide and/or other suitable material know to a person of ordinary skill in the art. The first interlayer insulating layer 205 and the second interlayer insulating layer 207 may include a single layer or a multi-layer including any combination of the aforementioned materials.

A first organic insulating layer 209 and a second organic insulating layer 211 may be arranged on the second interlayer insulating layer 207. The first organic insulating layer 209 and the second organic insulating layer 211 each may include an approximately flat top surface.

The pixel circuit PC may be electrically connected to a pixel electrode 221. For example, a contact metal layer CM may be between the pixel circuit PC and the pixel electrode 221 as shown in FIG. 8. The contact metal layer CM may be connected to the pixel circuit PC through a contact hole formed in the first organic insulating layer 209, and the pixel electrode 221 may be connected to the contact metal layer CM through a contact hole formed in the second organic insulating layer 211 on the contact metal layer CM. The contact metal layer CM may include a conductive material including Mo, Al, Cu, and/or Ti and may include a single layer or a multi-layer including any combination of the above materials. In some embodiments, the contact metal layer CM may include a multi-layer of Ti/Al/Ti.

The first organic insulating layer 209 and the second organic insulating layer 211 each may include an organic insulating material including a general-purpose polymer such as polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof. In some embodiments, the first organic insulating layer 209 and the second organic insulating layer 211 each may include a polyimide.

The pixel electrode 221 may be formed on the second organic insulating layer 211. The pixel electrode 221 may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). In some embodiments, the pixel electrode 221 may include a reflective layer including silver (Ag), magnesium (Mg), aluminum (Al), platinum (Pt), palladium (Pd), gold (Au), nickel (Ni), neodymium (Nd), iridium (Ir), chrome (Cr), or a compound thereof. In further embodiments, the pixel electrode 221 may further include a layer including ITO, IZO, ZnO, or $In_2O_3$ on and/or below the reflective layer. For example, the pixel electrode 221 may include a multi-layer of ITO/Ag/ITO.

A pixel-defining layer 215 may be formed on the pixel electrode 221. The pixel-defining layer 215 includes an opening that exposes a top surface of the pixel electrode 221 and may cover edges of the pixel electrode 221. In some embodiments, the pixel-defining layer 215 may include an organic insulating material. Alternatively, the pixel-defining layer 215 may include an inorganic insulating material such as silicon nitride ($SiN_x$), silicon oxynitride (SiON), or silicon oxide ($SiO_x$). Alternatively, the pixel-defining layer 215 may include an organic insulating material and an inorganic insulating material.

An intermediate layer 222 may include an emission layer 222b. The emission layer 222b may include a polymer organic material or low molecular weight organic material emitting light having a certain color. Alternatively, the intermediate layer 222 may include at least one organic material layer on and/or below the emission layer 222b. In some embodiments, the intermediate layer 222 may include a first functional layer 222a arranged below the emission layer 222b and/or a second functional layer 222c arranged on the emission layer 222b.

The first functional layer 222a may include a single layer or a multi-layer. For example, in the case where the first functional layer 222a includes a polymer material, the first functional layer 222a may include a hole transport layer (HTL), which has a single-layered structure, and may include poly-(3,4)-ethylene-dihydroxy thiophene (PEDOT) or polyaniline (PAN). In embodiments in which the first functional layer 222a includes a low molecular weight material, the first functional layer 222a may include a hole injection layer (HIL) and a hole transport layer (HTL).

The second functional layer 222c may be omitted. For example, in embodiments in which the first functional layer 222a and the emission layer 222b include a polymer material, it may be desirable to form the second functional layer 222c. The second functional layer 222c may include a single layer or a multi-layer. The second functional layer 222c may include an electron transport layer (ETL) and/or an electron injection layer (EIL).

The emission layer 222b of the intermediate layer 222 may be arranged for each pixel in the display area DA. That is, the emission layer 222b may be patterned to correspond to the pixel electrode 221. Unlike the emission layer 222b, the first functional layer 222a and/or the second functional layer 222c of the intermediate layer 222 may be in the display area DA and the intermediate area MA.

An opposite electrode 223 may include a conductive material having a low work function. For example, the opposite electrode 223 may include a (semi) transparent (i.e., a semi-transparent or fully transparent) layer including Ag, Mg, Al, Pt, Pd, Au, Ni, Nd, Ir, Cr, lithium (Li), calcium (Ca), or an alloy thereof. Alternatively, the opposite electrode 223 may further include a layer including ITO, IZO, ZnO, or $In_2O_3$ on the (semi) transparent layer. The opposite electrode 223 may be formed in the display area DA and on the intermediate area MA. The first functional layer 222a, the second functional layer 222c, and the opposite electrode 223 may be formed by thermal deposition.

A capping layer 230 may be located on the opposite electrode 223. For example, the capping layer 230 may include lithium fluoride (LiF) and may be formed by thermal deposition. In some embodiments, the capping layer 230 may be omitted.

A spacer 217 may be formed on the pixel-defining layer 215. The spacer 217 may include an organic insulating material such as a polyimide. Alternatively, the spacer 217 may include an inorganic insulating material or may include an organic insulating material and an inorganic insulating material.

The spacer 217 may include a material different from the pixel-defining layer 215 or may include the same material as the pixel-defining layer 215. For example, the pixel-defining layer 215 and the spacer 217 may be simultaneously formed during a mask process that uses a half-tone mask. In some embodiments, the pixel-defining layer 215 and the spacer 217 may include a polyimide.

The organic light-emitting diode OLED may be covered by a thin-film encapsulation layer 300. The thin-film encapsulation layer 300 may include at least one organic encapsulation layer and/or at least one inorganic encapsulation layer, and it is shown in FIG. 8 that the thin-film encapsulation layer 300 includes first and second inorganic encapsulation layers 310 and 330 and an organic encapsulation layer 320 therebetween. In other embodiments, the number of organic encapsulation layers, the number of inorganic encapsulation layers, and stacking orders may be changed.

The first inorganic encapsulation layer 310 and the second inorganic encapsulation layer 330 may include one or more inorganic materials, such as aluminum oxide, titanium oxide, tantalum oxide, hafnium oxide, zinc oxide, silicon oxide, silicon nitride, and/or silicon oxynitride. The first inorganic encapsulation layer 310 and the second inorganic encapsulation layer 330 may include a single layer or a multi-layer including any combination of the aforementioned materials.

The organic encapsulation layer 320 may include a polymer-based material. Examples of the polymer-based material may include acrylic resin, epoxy resin, polyimide, polyethylene and/or other suitable materials known to a person of ordinary skill in the art. In some embodiments, the organic encapsulation layer 320 may include acrylate.

The first inorganic encapsulation layer 310 and the second inorganic encapsulation layer 330 may have different thicknesses. A thickness of the first inorganic encapsulation layer 310 may be greater than a thickness of the second inorganic encapsulation layer 330. Alternatively, the thickness of the second inorganic encapsulation layer 330 may be greater than the thickness of the first inorganic encapsulation layer 310, or the first inorganic encapsulation layer 310 and the second inorganic encapsulation layer 330 may have the same thickness.

Referring to the intermediate area MA of FIG. 8, the intermediate area MA may include a third area MA1 relatively distant from a first area OA and a fourth area MA2 relatively close to the first area OA. In the third area MA1, which is a portion adjacent to the display area DA, signal lines bypassing the first area OA may be arranged. The signal lines may correspond to one of the extension portions DL-L1 and DL-L2 and the circuitous portions DL-D1 and DL-D2 of the data line DL, and the extension portion SL-L and the circuitous portion SL-D of the scan line SL of FIG. 7.

In some embodiments, the data lines DL in the third area MA1 may be alternately arranged with an insulating layer therebetween. For example, neighboring data lines DL may be alternately arranged in a manner in which one of the neighboring data lines DL is arranged below the insulating layer (e.g., the first organic insulating layer 209) and the other is arranged on the insulating layer (e.g., the first organic insulating layer 209). In the case where the data lines DL are alternately arranged with the insulating layer therebetween, a distance (or pitch) (Δd) between the data lines DL may be reduced.

Similarly, the scan lines SL, for example, circuitous portions of the scan lines SL, may be located in the third area MA1. Similar to the data lines DL described above, the scan lines SL may be alternately arranged with an insulating layer therebetween. For example, neighboring scan lines SL may be alternately arranged in a manner in which one of the neighboring scan lines SL is arranged below the insulating layer (e.g., the first interlayer insulating layer 205) and the other is arranged on the insulating layer (e.g., the first interlayer insulating layer 205). In this case, the scan line SL arranged below the insulating layer (e.g., the first interlayer insulating layer 205), among the scan lines SL, may include the same material as the gate electrode GE of the thin-film transistor TFT, and the scan line SL arranged on the insulating layer (e.g., the first interlayer insulating layer 205), among the scan lines SL, may include the same material as an upper electrode CE2 of the storage capacitor Cst.

A structure in which the data lines DL and the scan lines SL described above are alternately arranged with the insulating layers therebetween may be applied to the third area MA1 and a portion of the display area DA and/or the peripheral area PA (e.g., a fan-out area).

A partition wall having two or more dams (hereinafter, referred to as the multi-partition wall MPW) may be arranged on the signal lines SL of the third area MA1. The multi-partition wall MPW may include three or more dams (e.g., D1, D2, and D3) spaced apart from each other with valleys V therebetween. For example, the valleys V may be between a first dam D1 and a second dam D2 and between the second dam D2 and a third dam D3, respectively. The first, second, and third dams D1, D2, and D3 of FIG. 8 may correspond to the dams D of FIG. 7. By using the multi-partition wall MPW, the organic encapsulation layer 320 of the thin-film encapsulation layer 300 may be prevented from overflowing into the fourth area MA2.

The first dam D1, the second dam D2, and the third dam D3 may be spaced apart from each other at certain intervals, and the spaced areas may form the valleys V. The valleys V may expose at least a portion of a top surface of the second organic insulating layer 211. Though it is shown in FIG. 8 that the multi-partition wall MPW includes the three dams (e.g., the first to third dams D1 to D3) and the two valleys V therebetween, the number of dams, the number of valleys, widths of the dams, widths of the valleys, heights of the dams, depths of the valleys, and a stacked structure of the dams may be modified. In an embodiment shown in FIG. 11, a display panel 10-3 having a multi-partition wall MPW including four dams (e.g., first, second, third, and fourth dams D1, D2, D3, and D4) and three valleys V therebetween.

Figure 17:
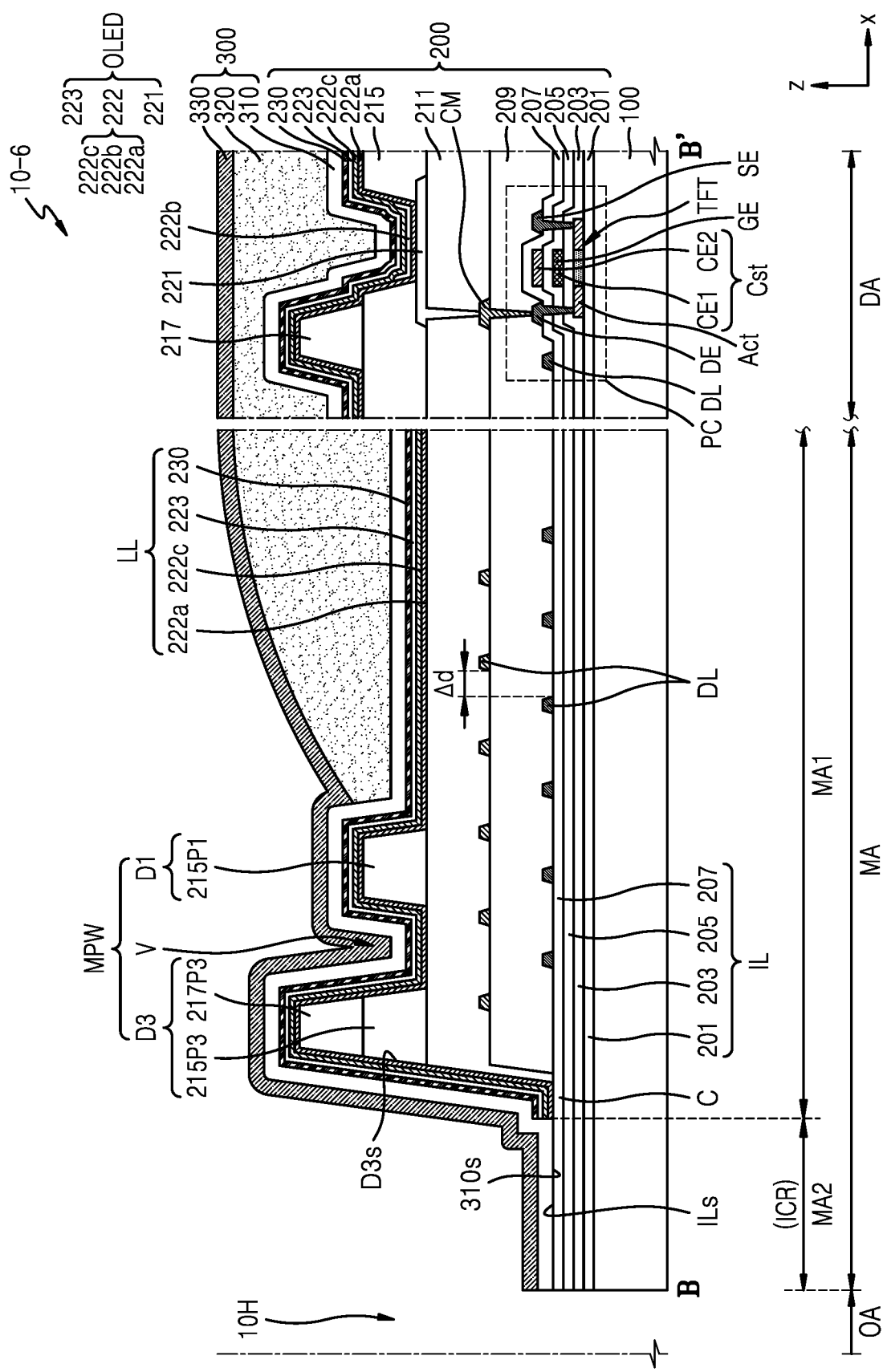
FIG. 17 is a cross-sectional view of a display panel according to another embodiment of the present disclosure.

As shown in FIG. 17, a display apparatus 10-6 according to an embodiment may include a multi-partition wall MPW having one or more valleys V on signal lines in a third area MA1. The multi-partition wall MPW may include two or more dams (e.g., first and third dams D1 and D3) spaced apart from each other with a valley V therebetween.

The valley V may be between the first dam D1 and the third dam D3. In other words, the first dam D1 and the third dam D3 may be spaced apart from each other at a certain interval, and the spaced area may form the valley V. The valley V may expose at least a portion of a top surface of a second organic insulating layer 211.

Referring back to FIG. 8, the first dam D1 may be arranged closest to the display area DA, and the organic encapsulation layer 320 may be isolated by the first dam D1. In other words, the first dam D1 directly confines the organic encapsulation layer 320, and in the case where the organic encapsulation layer 320 overflows beyond the first dam D1, the organic encapsulation layer 320 may be prevented from overflowing into the fourth area MA2 by the second dam D2, the third dam D3, and the valley V therebetween sequentially arranged toward the fourth area MA2.

The first dam D1, the second dam D2, and the third dam D3 may have a structure in which at least one layer of the first to third dams D1 to D3 is stacked on the second organic insulating layer 211, respectively. In an embodiment, the first dam D1 may include a first layer 215P1 arranged on the second organic insulating layer 211, the second dam D2 may include a first layer 215P2 arranged on the second organic insulating layer 211, and the third dam D3 may include a first layer 215P3 and a second layer 217P3 arranged on the second organic insulating layer 211. In another embodiment, as shown in FIG. 10, the first dam D1 may include the first layer 215P1 and a second layer 217P1 arranged on the second organic insulating layer 211, the second dam D2 may include the first layer 215P2 and a second layer 217P2 arranged on the second organic insulating layer 211, and the third dam D3 may include the first layer 215P3 and the second layer 217P3 arranged on the second organic insulating layer 211.

Figure 10:
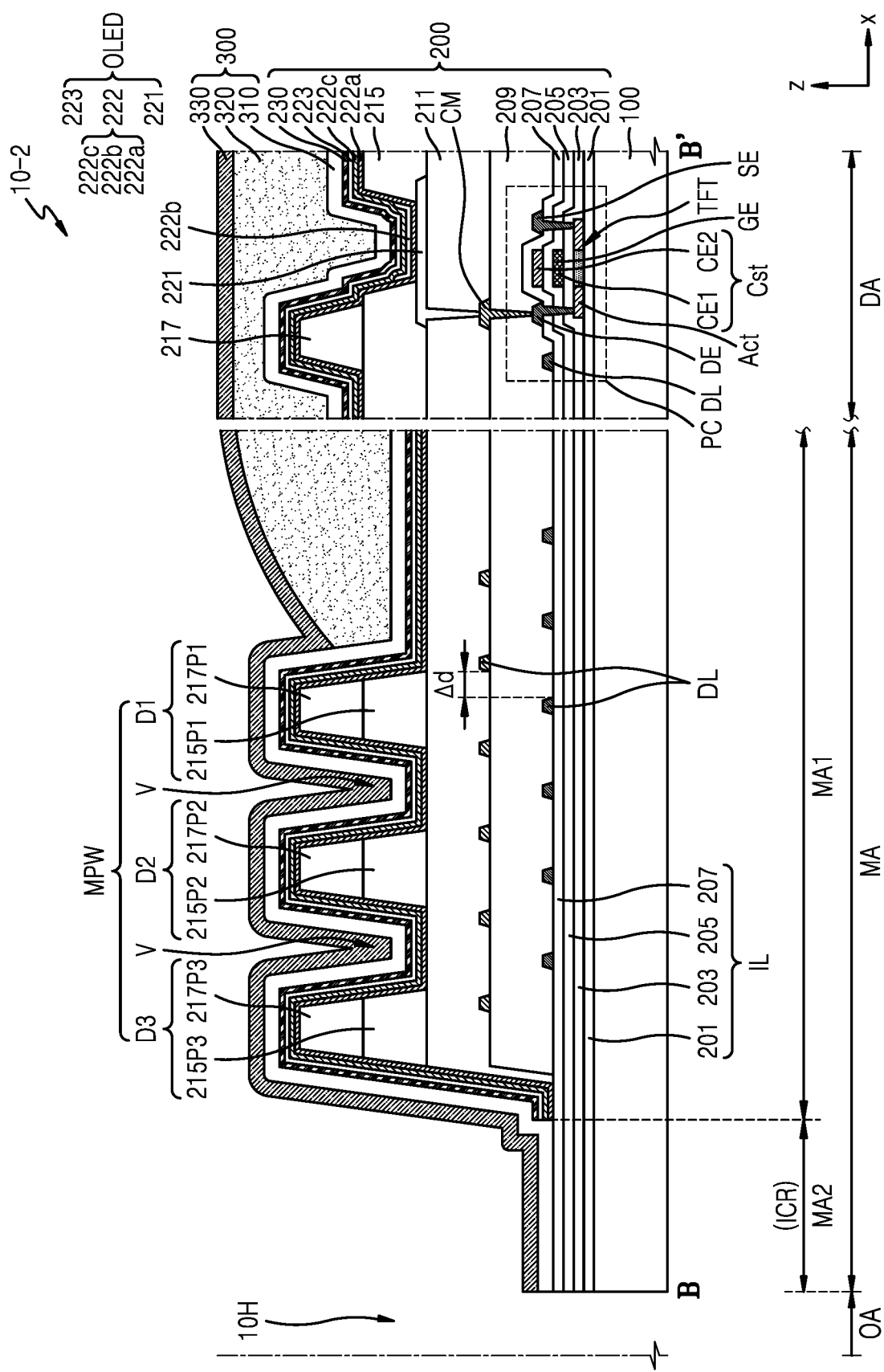
FIGS. 10 and 11 are cross-sectional views of display panels according to embodiments of the present disclosure.
Figure 11:
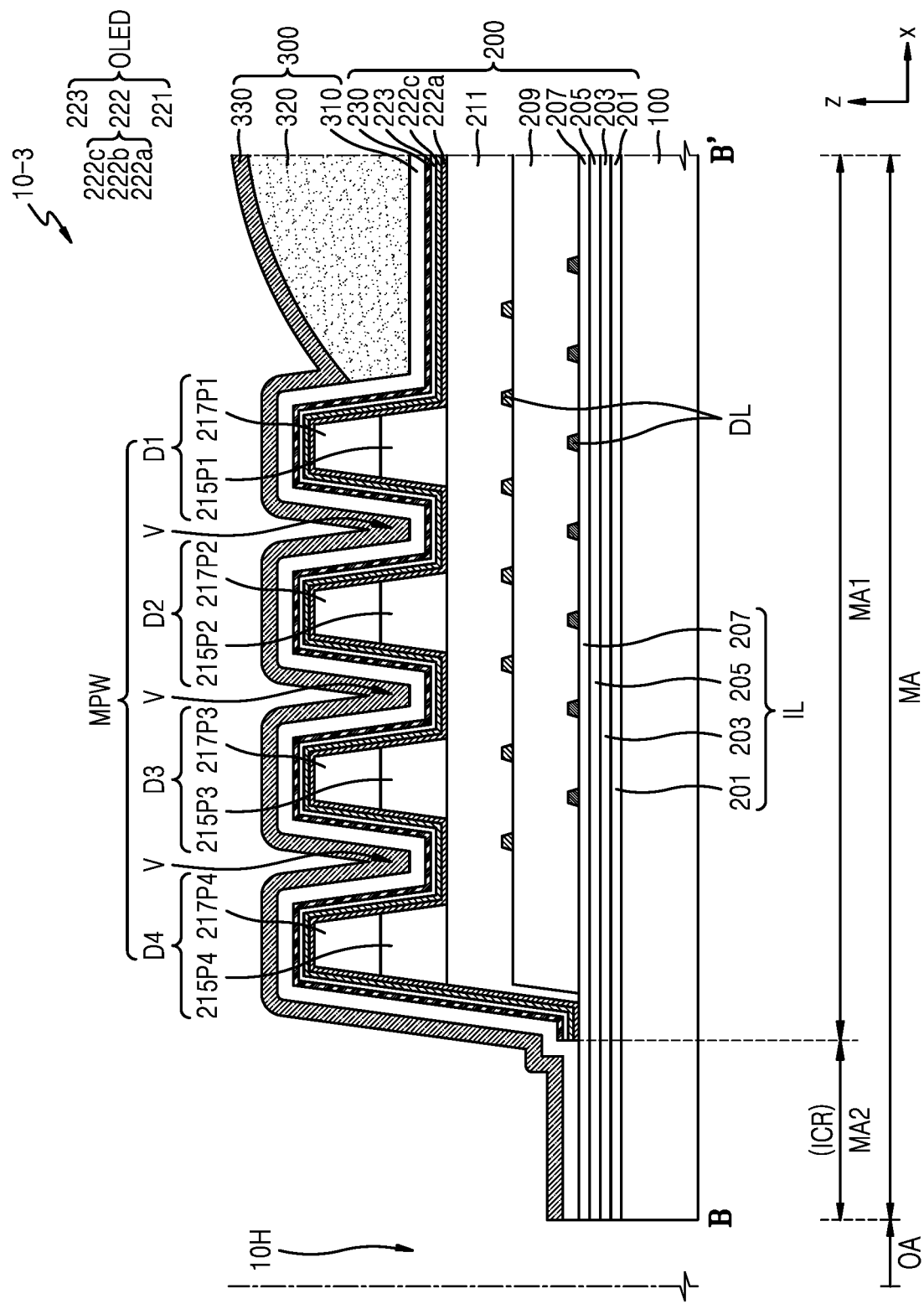

Referring to FIGS. 8 and 10, the first layers 215P1, 215P2, and 215P3 may include the same material as the pixel-defining layer 215 in the display area DA, and the second layers 217P1, 217P2, and 217P3 may include the same material as the spacer 217 in the display area DA. Because the first to third dams D1 to D3 include one or all of the second layers 217P1, 217P2, and 217P3, respectively, heights of the first to third dams D1 to D3 may be increased to effectively reduce or prevent the organic encapsulation layer 320 from overflowing.

A stacked structure LL extending from the display area DA may be arranged to cover the multi-partition wall MPW on the third area MA1. The stacked structure LL extending to the third area MA1 may include the first functional layer 222a, the second functional layer 222c, the opposite electrode 223, and the capping layer 230. In the display area DA, the stacked structure LL may further include the emission layer 222b.

The stacked structure LL may also be arranged on the third dam D3 that is relatively farthest from the display area DA. The stacked structure LL may be arranged to cover a top surface of the third dam D3 and a side surface of the third dam D3 arranged toward the fourth area MA2. The stacked structure LL extends to cover side cross-sections (i.e., sides) of the first organic insulating layer 209 and the second organic insulating layer 211, and may be cut off at a boundary between the third area MA1 and the fourth area MA2. On the stacked structure LL covering the multi-partition wall MPW, the first inorganic encapsulation layer 310 and the second inorganic encapsulation layer 330 of the thin-film encapsulation layer 300 may be arranged. The first inorganic encapsulation layer 310 and the second inorganic encapsulation layer 330 may extend to the fourth area MA2.

Referring to the fourth area MA2, an inorganic insulating layer IL may be arranged to extend from the display area DA to the third area MA1 and the fourth area MA2. In other words, the inorganic insulating layer IL may be arranged on a front surface of the substrate 100 except for the first area OA. The inorganic insulating layer IL may include at least one of the buffer layer 201, the gate insulating layer 203, the first interlayer insulating layer 205, or the second interlayer insulating layer 207, which all include an inorganic insulating material. It is shown in FIG. 8 that the inorganic insulating layer IL includes the buffer layer 201, the gate insulating layer 203, the first interlayer insulating layer 205, and the second interlayer insulating layer 207.

The stacked structure LL may not be arranged on the fourth area MA2. The stacked structure LL that was formed on the fourth area MA2 may be all removed before a process of forming the thin-film encapsulation layer 300. In an embodiment, the stacked structure LL that was formed on the fourth area MA2 may be removed by using a laser lift-off method. A manufacturing process in this regard will be mainly described later in detail with reference to FIGS. 14A to 14D.

Therefore, the first inorganic encapsulation layer 310 and the second inorganic encapsulation layer 330 of the thin-film encapsulation layer 300 may be arranged on the inorganic insulating layer IL corresponding to the fourth area MA2. The first inorganic encapsulation layer 310 may be directly arranged on the inorganic insulating layer IL, so that a top surface ILs of the inorganic insulating layer IL is in surface contact with a bottom surface 310s of the first inorganic encapsulation layer 310.

Referring to FIG. 9, the stacked structure LL may include a cut surface LLe that is cut off at the boundary between the third area MA1 and the fourth area MA2. That is, the third area MA1 and the fourth area MA2 may be defined by the presence of the stacked structure LL. The fourth area MA2 may be an area in which the stacked structure LL is not arranged. Therefore, on the substrate 100 corresponding to the fourth area MA2, the inorganic insulating layer IL, the first inorganic encapsulation layer 310, and the second inorganic encapsulation layer 330, which all include an inorganic insulating material, may be arranged and an organic material layer is not arranged. The fourth area MA2 may be defined as an inorganic contact region ICR (as shown in FIG. 8) formed by only contact between inorganic layers.

In the present embodiment, the stacked structure LL may include the first functional layer 222a, the second functional layer 222c, the opposite electrode 223, and the capping layer 230, of which the first functional layer 222a and the second functional layer 222c include an organic material. Moisture and impurities are easily introduced through the organic material layers, which are then transferred to the display element layer 200A (shown, for example, in FIGS. 4A-4D), causing defective pixels, etc. In order to prevent this issue, in the display apparatus 1 according to an embodiment, a portion of the stacked structure LL formed on the fourth area MA2 that is adjacent to the first area OA is removed, and the inorganic contact region ICR in which the inorganic insulating layer IL directly contacts the first inorganic encapsulation layer 310 is formed in the fourth area MA2, so that the penetration of moisture and impurities that may be introduced through the organic material layers may be effectively reduced or prevented.

In some embodiments, shown for example in FIG. 9, the stacked structure LL that was formed on the fourth area MA2 may be removed by using the laser lift-off method. Therefore, an end portion 222ae of the first functional layer 222a, an end portion 222ce of the second functional layer 222c, an end portion 223e of the opposite electrode 223, an end portion 230e of the capping layer 230, which all constitute the cut surface LLe of the stacked structure LL, correspond to each other and may be formed on the same plane. In addition, because laser irradiated onto the cut surface LLe of the stacked structure LL is irradiated approximately perpendicular to a top surface 100s of the substrate 100, the cut surface LLe of the stacked structure LL may be approximately perpendicular to the top surface 100s of the substrate 100. The first inorganic encapsulation layer 310 may cover the cut surface LLe of the stacked structure LL and contact the inorganic insulating layer IL.

Figure 12:
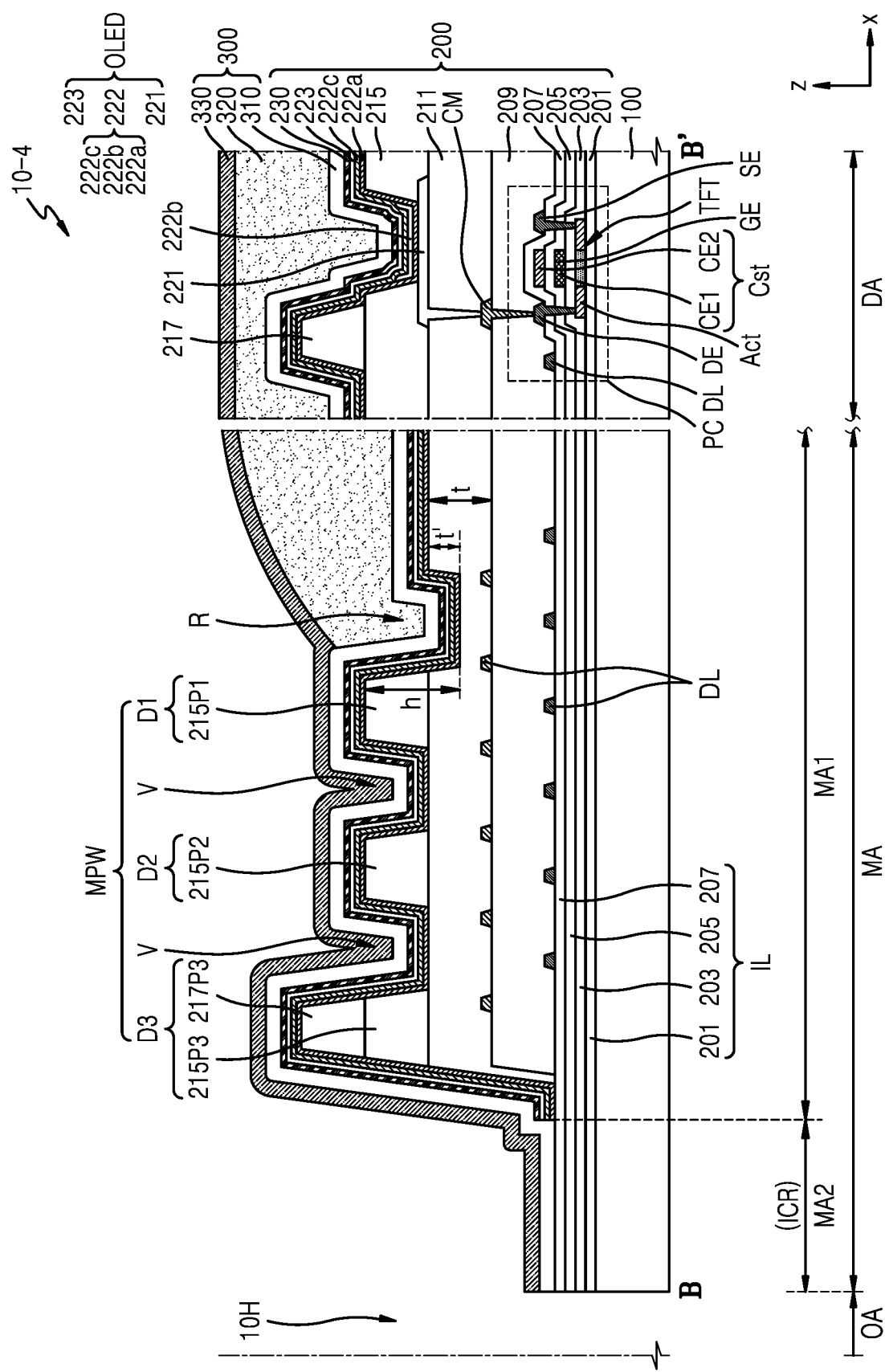
FIG. 12 is a cross-sectional view of a display panel according to an embodiment of the present disclosure.

FIG. 12 is a cross-sectional view of a display panel 10-4 according to an embodiment of the present disclosure.

The display panel 10-4 of FIG. 12 is a modified example of FIG. 8 and is different from the aforementioned embodiments in that a groove portion R is provided adjacent to the first dam D1. Hereinbelow, differences will be mainly described. Other configurations are the same as or similar to the aforementioned embodiments.

Referring to FIG. 12, the groove portion R may be located on one side of the first dam D1 that is arranged closest to the display area DA. The groove portion R may be a type of recess in which a portion of the second organic insulating layer 211 is drawn toward the substrate 100. A portion of the organic encapsulation layer 320 may be located in the groove portion R. As described above, because the groove portion R is provided on one side of the first dam D1, on which the organic encapsulation layer 320 is arranged, a height h of the first dam D1 is increased, and thus, the organic encapsulation layer 320 is isolated by the first dam D1 to more effectively reduce or prevent the organic encapsulation layer 320 from overflowing.

A depth t' of the groove portion R may be about 40% to about 50% of a thickness t of the second organic insulating layer 211. For example, in the case where the thickness t of the second organic insulating layer 211 is about 1.4 µm to about 1.8 µm, the depth t' of the groove portion R may be about 0.7 µm to about 0.9 µm. This is because, in the case where the depth t' of the groove portion R is 50% or more of the thickness t of the second organic insulating layer 211, wires arranged on the first organic insulating layer 209 (e.g., data lines DL) may be affected, and in the case where the depth t' of the groove portion R is 40% or less of the thickness t of the second organic insulating layer 211, the ability to reduce or prevent the organic encapsulation layer 320 from overflowing is weak. However, the embodiment is not limited thereto, and the depth t' of the groove portion R may vary as necessary.

Figure 13:
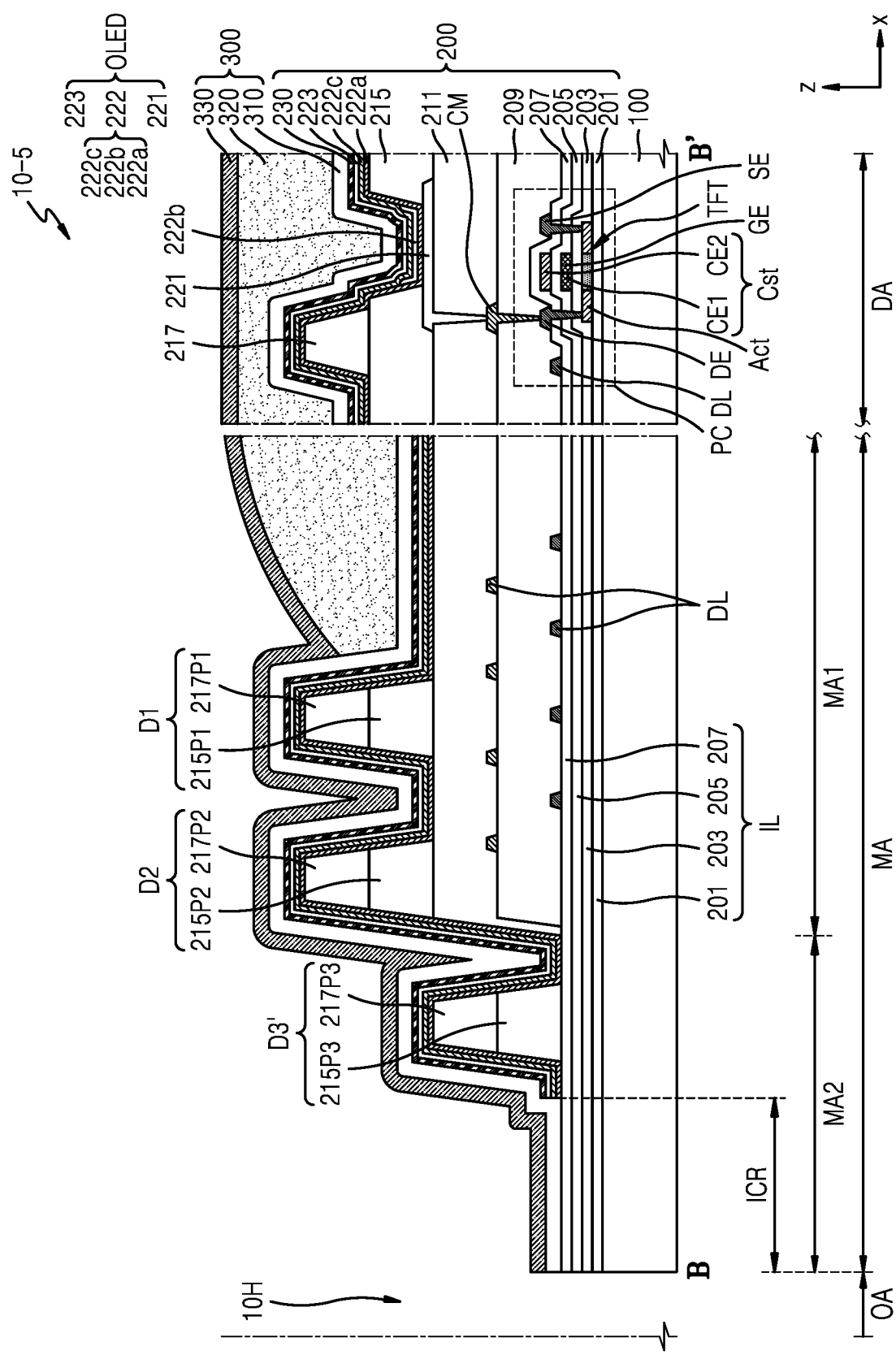
FIG. 13 is a cross-sectional view of a display panel according to another embodiment of the present disclosure.

FIG. 13 is a cross-sectional view of a display panel 10-5 according to another embodiment of the present disclosure.

The display panel 10-5 of FIG. 13 is different from the aforementioned embodiments in a structure corresponding to the intermediate area MA. Hereinbelow, differences in the structure of the intermediate area MA will be mainly described. Other configurations are the same as or similar to the aforementioned embodiments.

Referring to FIG. 13, the multi-partition wall MPW may include the first dam D1 and the second dam D2 arranged in the third area MA1, and a third dam D3' arranged in the fourth area MA2. The first dam D1 and the second dam D2 may be arranged on the second organic insulating layer 211 located in the third area MA1, and the third dam D3 may be located on the inorganic insulating layer IL located in the fourth area MA2.

Unlike the aforementioned embodiments, in the display panel 10-5 of FIG. 13, a portion of the multi-partition wall MPW (e.g., the third dam D3') is arranged in the fourth area MA2. The third dam D3' may be understood as a final structure for reducing or preventing the case where the organic encapsulation layer 320 isolated by the first dam D1 and the second dam D2 overflows.

In FIG. 13, the first dam D1 and the second dam D2 may have a structure in which at least one layer of the first and/or second dams D1 and D2 is arranged on the second organic insulating layer 211, respectively. In an embodiment, the first dam D1 may include the first layer 215P1 arranged on the second organic insulating layer 211, and the second dam D2 may include the first layer 215P2 arranged on the second organic insulating layer 211. The third dam D3' may include a first layer 215P3 and a second layer 217P3 arranged on the inorganic insulating layer IL. The first layers 215P1, 251P2, and 215P3 may include the same material as the pixel-defining layer 215 in the display area DA, and the second layers 217P1, 217P2, and 217P3 may include the same material as the spacer 217 in the display area DA.

In another embodiment, as shown in the aforementioned FIG. 10, the first dam D1 may include the first layer 215P1 and the second layer 217P1 arranged on the second organic insulating layer 211, the second dam D2 may include the first layer 215P2 and the second layer 217P2 arranged on the second organic insulating layer 211, and the third dam D3 may include the first layer 215P3 and the second layer 217P3 arranged on the second organic insulating layer 211.

The stacked structure LL, a shown, for example, in FIGS. 8 and 9, covers the multi-partition wall MPW and may be cut off at the fourth area MA2. An end portion of the stacked structure LL that is cut off may have the same shape as the aforementioned cut surface LLe of FIG. 9. The stacked structure LL may be removed from a partial area of the fourth area MA2, so as to form the inorganic contact region ICR, as shown in FIG. 13. An organic material layer is not arranged in the inorganic contact region ICR, and the inorganic insulating layer IL that is exposed by removing the portion of the stacked structure LL contacts the first inorganic encapsulation layer 310, so as to form an inorganic-inorganic contact.

The display panel 10-5 of FIG. 13 is different from the aforementioned embodiments in that a portion of the multi-partition wall MPW (e.g., the third dam D3') is located on the inorganic insulating layer IL corresponding to the fourth area MA2. Because the third dam D3' is located on the inorganic insulating layer IL corresponding to the fourth area MA2, the organic encapsulation layer 320 may be prevented from overflowing to the first area OA. However, as a result, a width of the inorganic contact region ICR is relatively narrow compared to the aforementioned embodiments. On the other hand, when the width of the inorganic contact region ICR is as wide as the aforementioned embodiments, a width of the intermediate area MA, which is a non-display area, may be increased as a result. Therefore, as in the display panels 10-1, 10-2, 10-3, and 10-4 of FIGS. 8 to 12, the multi-partition wall MPW is arranged on the second organic insulating layer 211 corresponding to the third area MA1, and three or more dams D and two more valleys V arranged therebetween are provided, and thus, a sufficient width of the inorganic contact region ICR may be obtained, and the width of the intermediate area MA may also be effectively reduced at the same time.

Though only the display apparatus has been mainly described so far, the embodiments are not limited thereto. For example, it will be understood that a method of manufacturing a display apparatus also falls within the scope of the embodiments.

FIGS. 14A to 14D, FIG. 15, and FIGS. 16A to 16D are cross-sectional views of a part of a method of manufacturing a display apparatus according to an embodiment of the present disclosure.

A manufacturing process mainly on the third area MA1 and the fourth area MA2 of the intermediate area MA is shown in FIGS. 14A to 14D. The display area DA that is not shown in FIGS. 14A to 14D is formed in the order of the stacked structure of the substrate 100 as shown in FIG. 8 and the other embodiments described above, and thus, a description of a method of manufacturing the display area DA will be consistent with the above description. FIGS. 14A to 14D may be a part of a process of forming the display panels 10-1, 10-2, 10-3, and 10-4 of FIGS. 8 to 12, respectively.

Figure 14A:
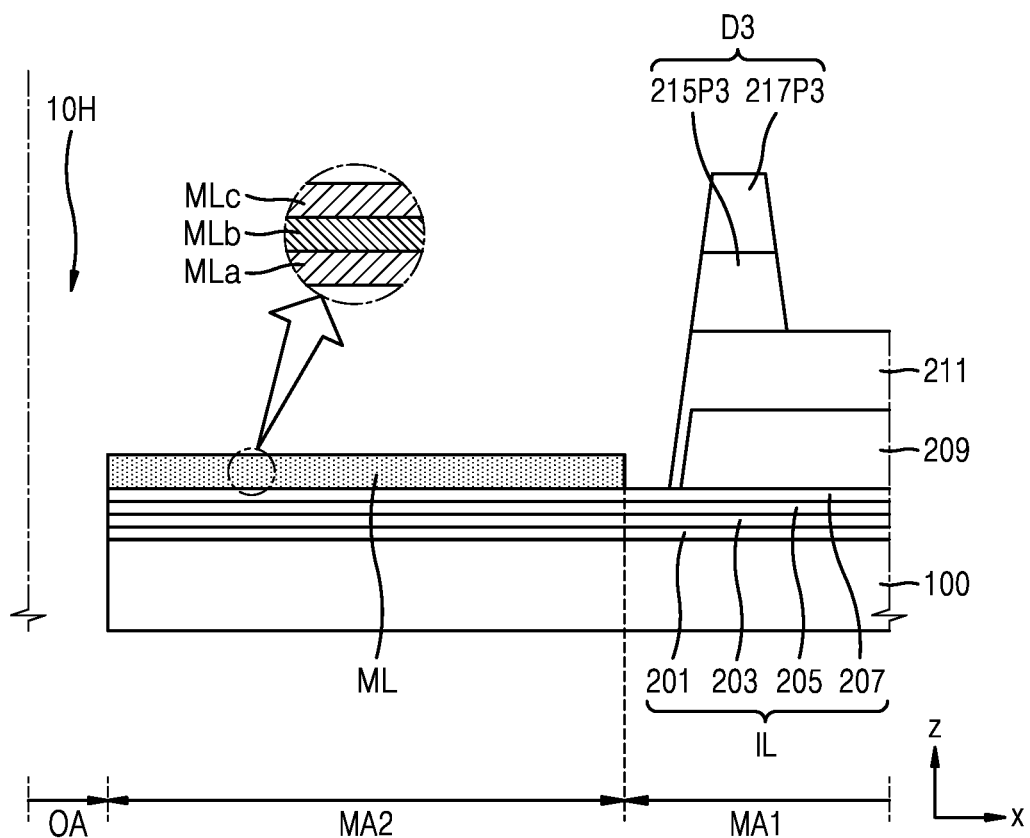
FIGS. 14A to 14D, FIG. 15, and FIGS. 16A to 16D are cross-sectional views of a part of a method of manufacturing a display apparatus according to an embodiment of the present disclosure.

Referring to FIG. 14A, the inorganic insulating layer IL is formed in the third area MA1 and the fourth area MA2 of the substrate 100. The inorganic insulating layer IL may include at least one of the buffer layer 201, the gate insulating layer 203, the first interlayer insulating layer 205, and/or the second interlayer insulating layer 207, which all include an inorganic insulating material. It is shown in FIG. 14A that the inorganic insulating layer IL includes the buffer layer 201, the gate insulating layer 203, the first interlayer insulating layer 205, and the second interlayer insulating layer 207.

The first organic insulating layer 209 and the second organic insulating layer 211 may be formed on the inorganic insulating layer IL corresponding to the third area MA1. Referring to FIG. 8 together, the inorganic insulating layer IL, the first organic insulating layer 209, and the second organic insulating layer 211 are also formed in the display area DA.

The multi-partition wall MPW may be formed on the second organic insulating layer 211, and a structure of the third dam D3 is shown in FIG. 14A. The third dam D3 may be formed by stacking the first layer 215P3 and the second layer 217P3. In some embodiments, the first layer 215P3 may be formed in the same process as the pixel-defining layer 215, and the second layer 217P3 may be formed in the same process as the spacer 217.

A metal layer ML may be formed on the fourth area MA2 before the multi-partition wall MPW is formed on the second organic insulating layer 211. In the present embodiment, an area in which the metal layer ML is formed may be defined as the fourth area MA2. In some embodiments, the metal layer ML may be formed in the same process as the pixel electrode 221. In this case, the metal layer ML may have a three-layered structure in which a lower layer MLa, an intermediate layer MLb, and an upper layer MLc are sequentially stacked. The lower layer MLa, the intermediate layer MLb, and the upper layer MLc may have, for example, a three-layered structure of ITO/Ag/ITO.

Figure 14B:
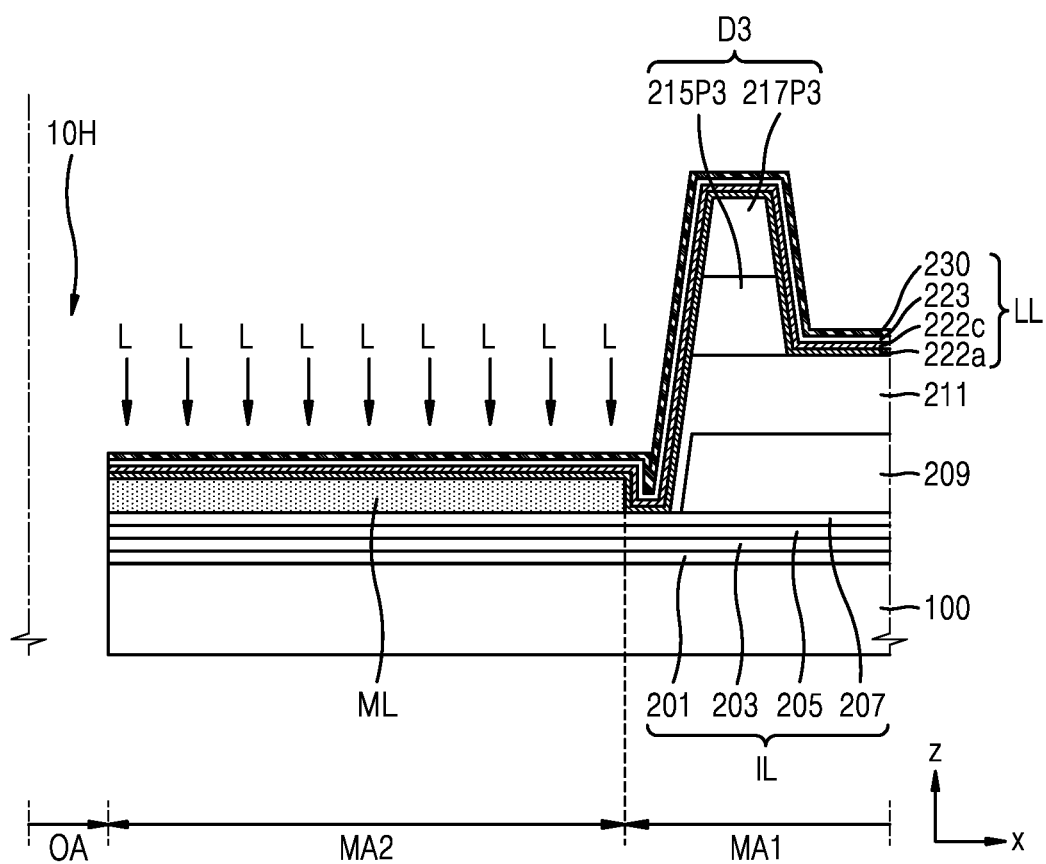

Thereafter, referring to FIG. 14B, the stacked structure LL is formed on the entire surface of the third area MA1 and the fourth area MA2. The stacked structure LL may be formed to cover the metal layer ML and the multi-partition wall MPW including the third dam D3. The stacked structure LL formed in the third area MA1 and the fourth area MA2 may be formed by stacking the first functional layer 222a, the second functional layer 222c, the opposite electrode 223, and the capping layer 230. In the display area DA, the stacked structure LL may further include the pixel electrode 221 and the emission layer 222b in addition to the above layers.

After the stacked structure LL is formed, laser L is irradiated onto the metal layer ML corresponding to the fourth area MA2. This may be a process of removing a portion of a layer (hereinafter, referred to as the target layer) by an irradiating laser using the laser lift-off method. In this case, the metal layer ML may be formed in an area of the target layer to increase an absorption layer of the laser L. In the present embodiment, by forming the stacked structure LL, which is the target layer, on the metal layer ML, a portion of the stacked structure LL may be effectively removed without damaging the inorganic insulating layer IL.

Figure 14C:
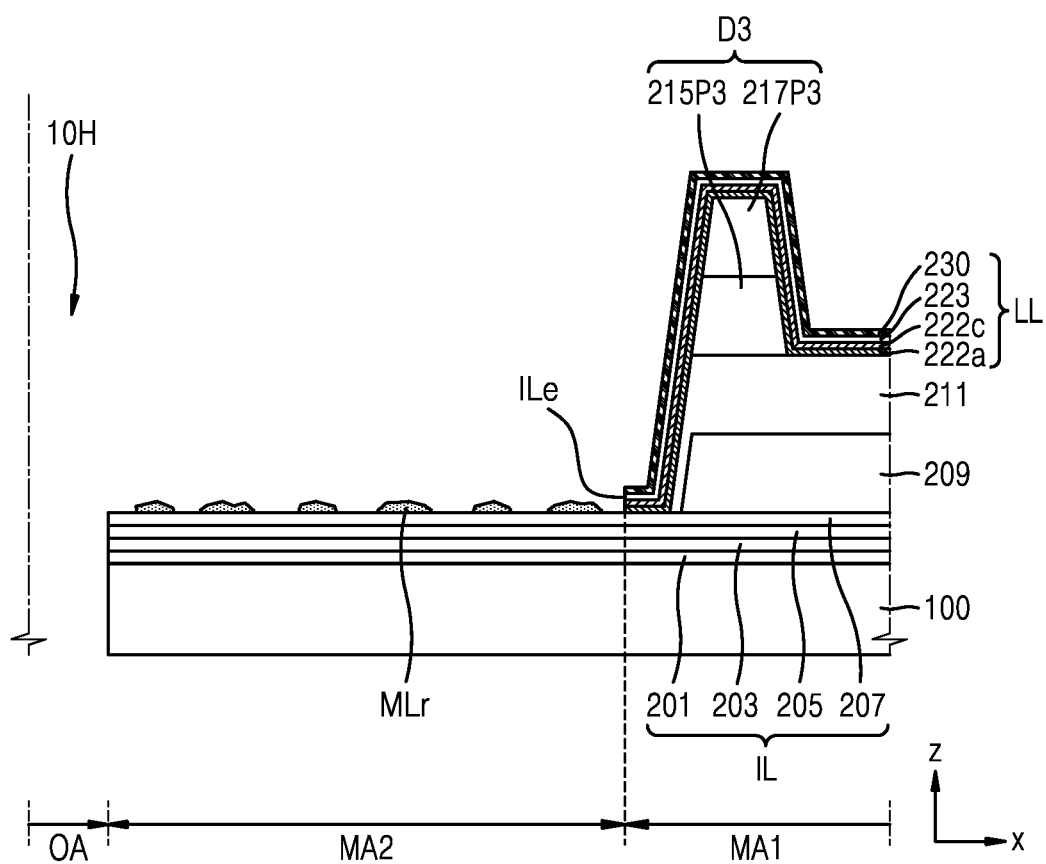

Thereafter, referring to FIG. 14C, the stacked structure LL on the fourth area MA2 is removed by a laser lift-off process. As the portion of the stacked structure LL is removed, the cut surface LLe of the stacked structure LL may be formed at the boundary between the third area MA1 and the fourth area MA2. A structure of the cut surface LLe is the same as the structure described above in FIG. 9.

In an embodiment, a portion of the metal layer ML may remain as a metal residual layer MLr in the fourth area MA2. In the laser lift-off process, the metal layer ML is arranged in an area onto which laser is irradiated, and thus is removed together with the target layer in a process of lifting off the target layer. During this process, a portion of the metal layer ML remains and forms the metal residual layer MLr. The metal residual layer MLr may be a residual of a portion of a lower layer MLa of FIG. 14, which is not completely removed, and may include ITO, for example.

Figure 14D:
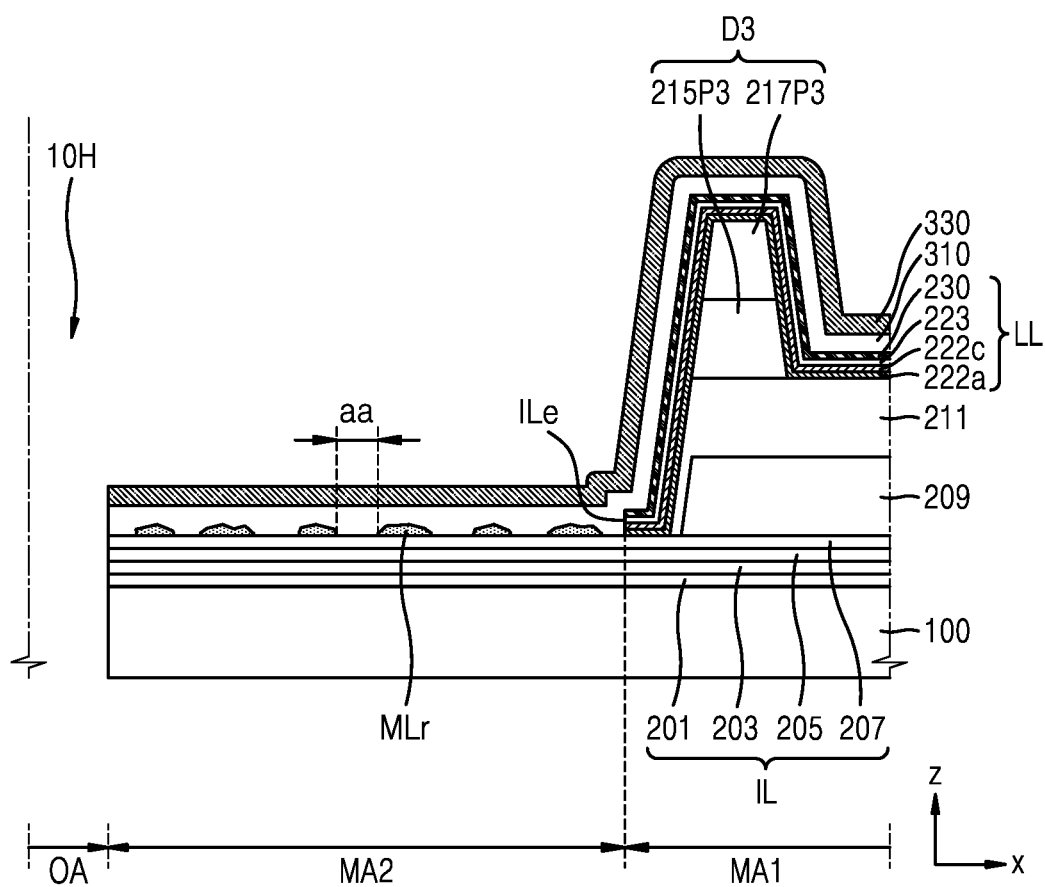

Thereafter, referring to FIG. 14D, the thin-film encapsulation layer 300 may be formed on the stacked structure LL. The first inorganic encapsulation layer 310 and the second inorganic encapsulation layer 330 of the thin-film encapsulation layer 300 may be formed on the third area MA1 and the fourth area MA2 of FIG. 14D. In the fourth area MA2, the first inorganic encapsulation layer 310 and the second inorganic encapsulation layer 330 may contact the inorganic insulating layer IL to form the inorganic contact region ICR.

In this case, the metal residual layer MLr may directly contact the first inorganic encapsulation layer 310. Because the metal residual layer MLr is intermittently present on the inorganic insulating layer IL, a partial area aa of the inorganic insulating layer IL may be exposed, and the first inorganic encapsulation layer 310 may directly contact the inorganic insulating layer IL.

Figure 15:
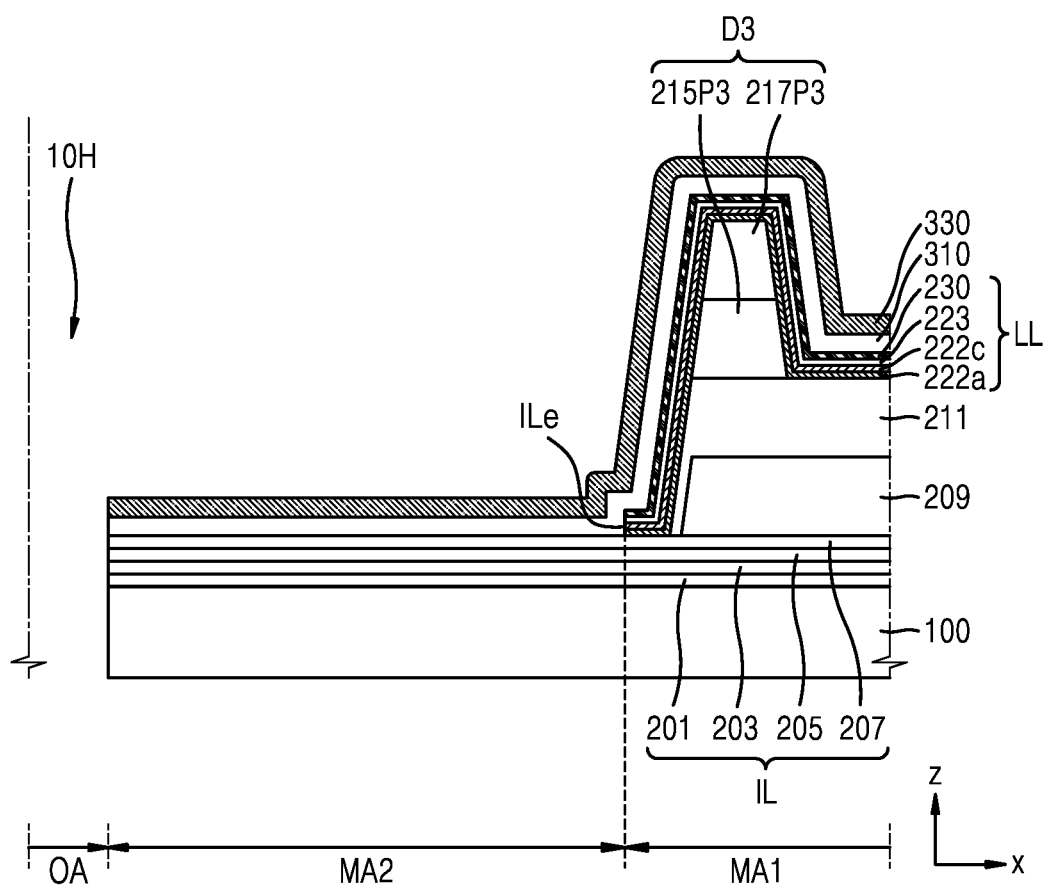

As shown in the embodiment of FIG. 15, in a process of removing the stacked structure LL on the fourth area MA2 by the laser lift-off process, all of the metal layer ML may also be removed. In this case, the metal residual layer MLr does not remain. In the case of the embodiment of FIG. 15, on the entire surface of the fourth area MA2, the first inorganic encapsulation layer 310 may directly contact a top surface of the inorganic insulating layer IL.

An organic material layer is not arranged in the inorganic contact region ICR, and the inorganic insulating layer IL that is exposed by removing a portion of the stacked structure LL contacts the first inorganic encapsulation layer 310, so as to form an inorganic-inorganic contact. In the display apparatus 1 according to an embodiment of the present disclosure, a portion of the stacked structure LL formed on the fourth area MA2 that is adjacent to the first area OA is removed, and the inorganic contact region ICR in which the inorganic insulating layer IL directly contacts the first inorganic encapsulation layer 310 is formed in the fourth area MA2, so that the penetration of moisture and impurities that may be introduced through the organic material layers may be effectively reduced or prevented.

Unlike FIGS. 14A to 14D described above, the stacked structure LL on the fourth area MA2 may be removed by the laser lift-off process without forming the metal layer ML.

Figure 16A:
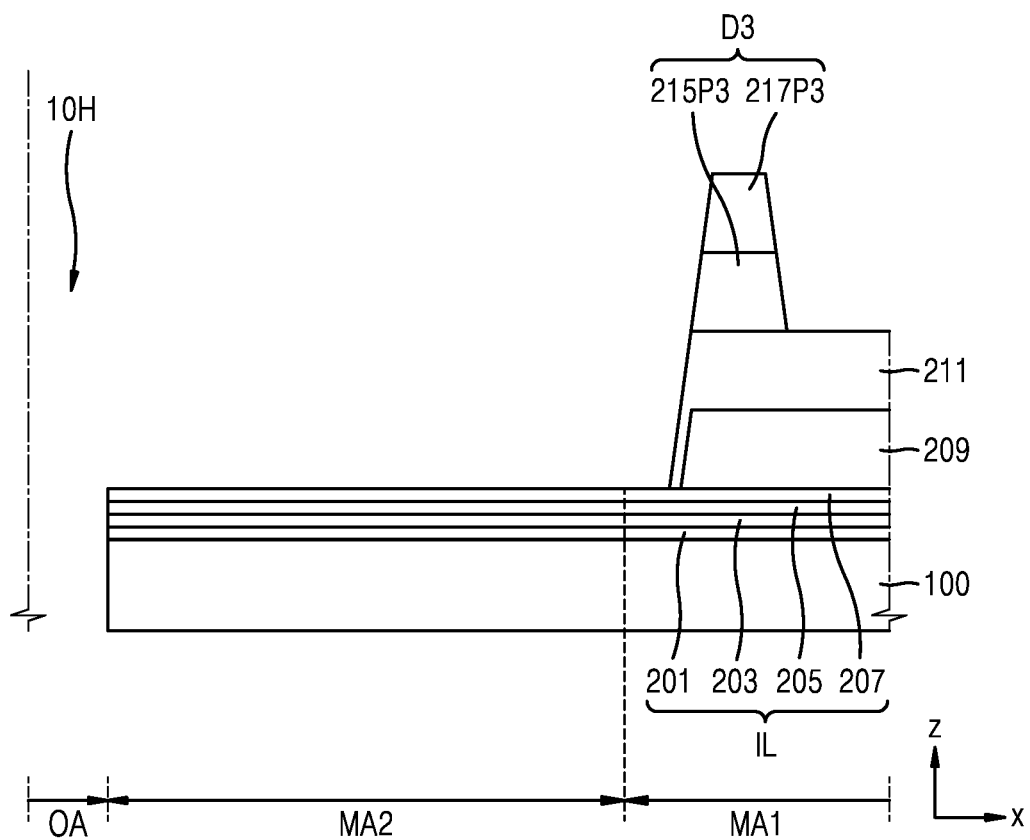

Referring to FIG. 16A, the inorganic insulating layer IL is formed on the third area MA1 and the fourth area MA2 of the substrate 100. The first organic insulating layer 209 and the second organic insulating layer 211 is formed on the inorganic insulating layer IL corresponding to the third area MA1. The multi-partition wall MPW may be formed on the second organic insulating layer 211, and a structure of the third dam D3 is shown in FIG. 16A.

Figure 16B:
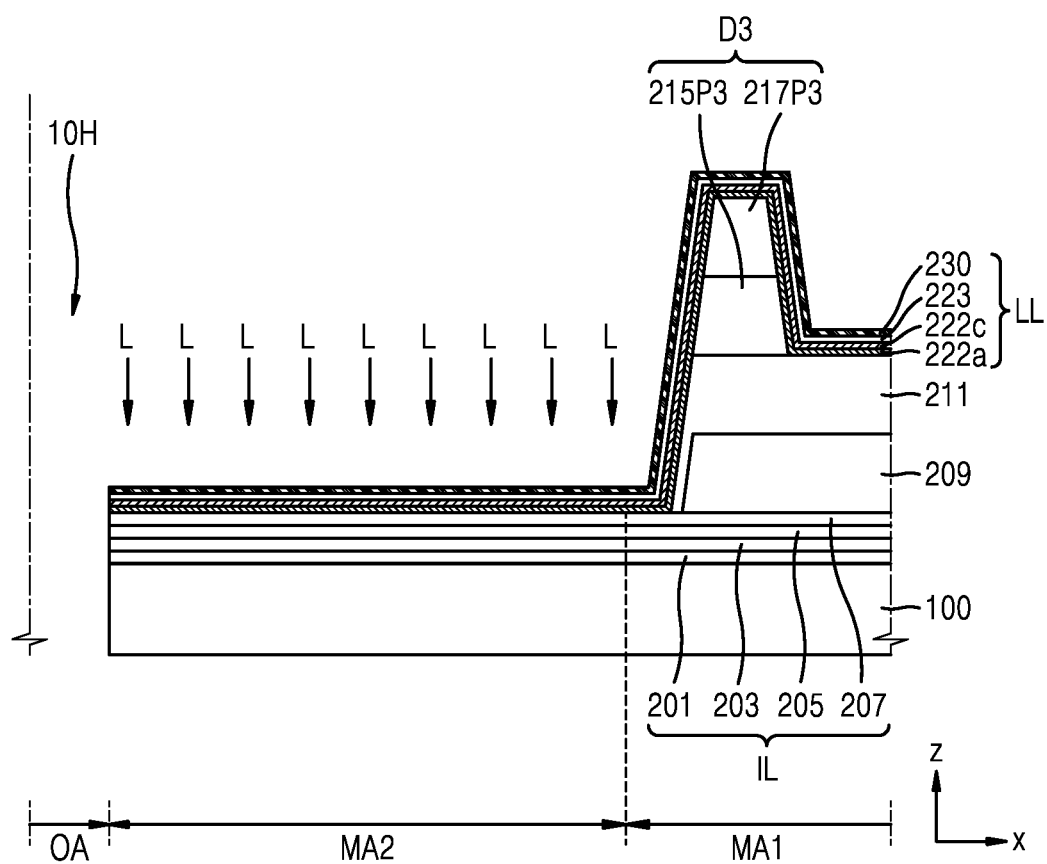

Thereafter, referring to FIG. 16B, the stacked structure LL is formed on the entire surface of the third area MA1 and the fourth area MA2. The stacked structure LL may be formed to cover the inorganic insulating layer IL and the multi-partition wall MPW including the third dam D3. The stacked structure LL is the same as the structure described above in FIG. 14B.

After the stacked structure LL is formed, laser L is irradiated onto the fourth area MA2. This may be a process of removing a portion of a layer (hereinafter, referred to as the target layer) by an irradiating laser using the laser lift-off method. In the present embodiment, the stacked structure LL corresponding to the fourth area MA2 may be effectively removed by using the stacked structure LL as the target layer.

Figure 16C:
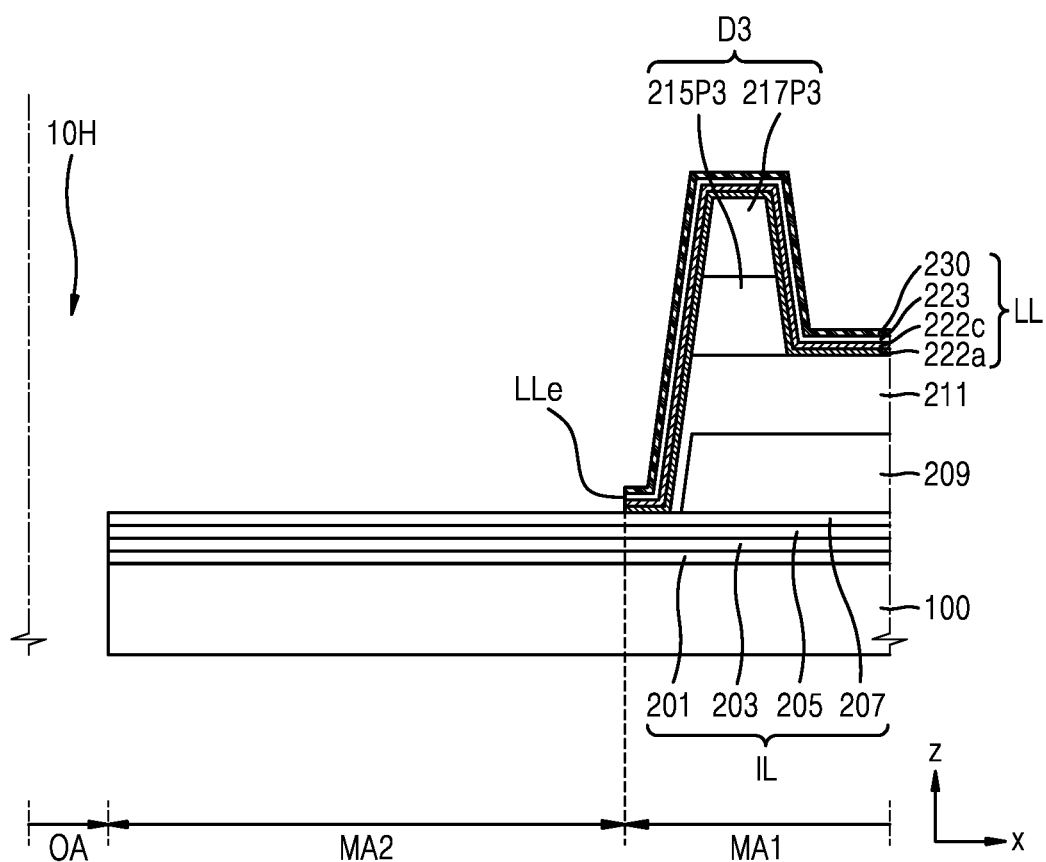

Thereafter, referring to FIG. 16C, as the portion of the stacked structure LL is removed, the cut surface LLe of the stacked structure LL may be formed at the boundary between the third area MA1 and the fourth area MA2. A structure of the cut surface LLe is the same as the structure described above with respect to FIG. 9.

Figure 16D:
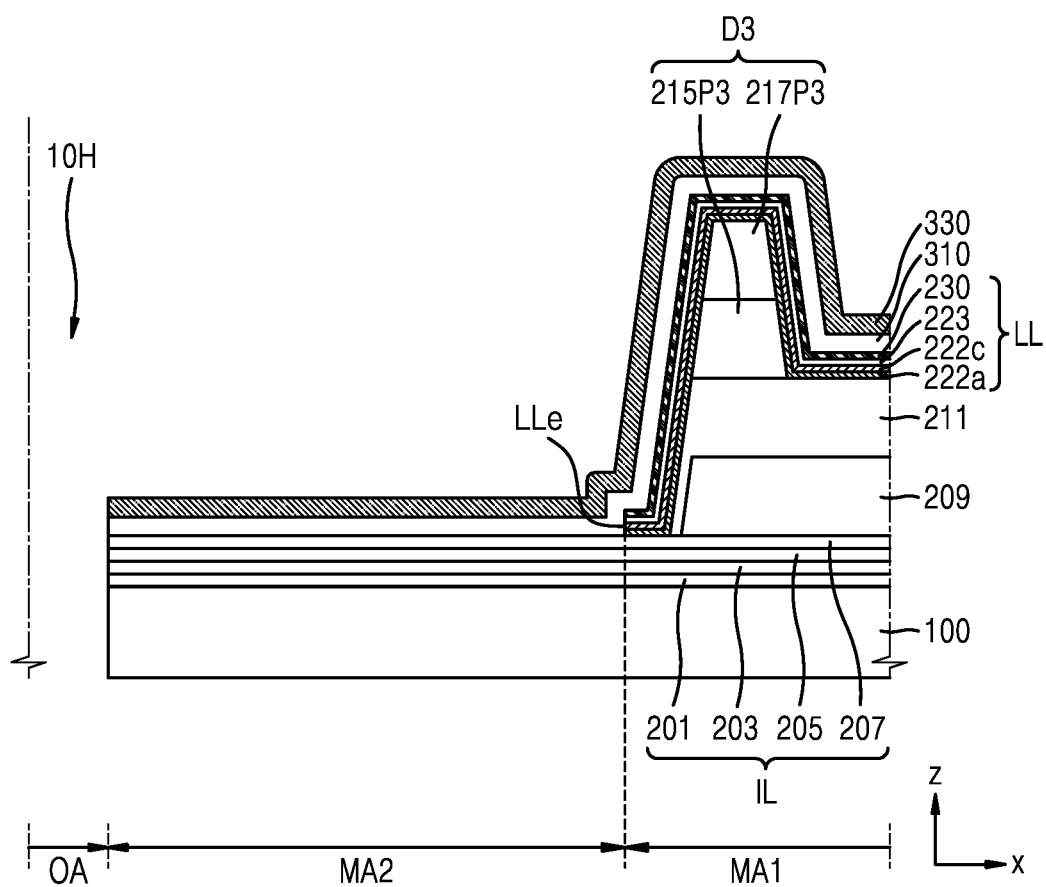

Thereafter, referring to FIG. 16D, the thin-film encapsulation layer 300 may be formed on the stacked structure LL. In the fourth area MA2, the first inorganic encapsulation layer 310 and the second inorganic encapsulation layer 330 may contact the inorganic insulating layer IL to form the inorganic contact region ICR.

According to one or more embodiments, a display apparatus including a first area in which various types of elements may be arranged in a display area, and a method of manufacturing the same may be implemented. However, the scope of the embodiments is not limited to the above description.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims and their equivalents.

What is claimed is:

1. A display apparatus comprising:
    a substrate defining an opening area and comprising a display area and an intermediate area between the opening area and the display area;
    an inorganic insulating layer in the display area and the intermediate area;
    a pixel circuit in the display area;
    an organic insulating layer on the pixel circuit;
    a pixel electrode on the organic insulating layer and electrically connected to the pixel circuit, an intermediate layer on the pixel electrode, and an opposite electrode on the intermediate layer;
    a thin-film encapsulation layer on the opposite electrode and comprising a first inorganic encapsulation layer, a second inorganic encapsulation layer, and an organic encapsulation layer between the first inorganic encapsulation layer and the second inorganic encapsulation layer; and a partition wall on the organic insulating layer in the intermediate area and comprising at least two dams, wherein the inorganic insulating layer is in contact with the thin-film encapsulation layer in an area between the partition wall and the opening area; and wherein each of the intermediate layer and the opposite electrode extends to the intermediate area and covers the partition wall.

2. The display apparatus of claim 1, wherein each of the intermediate layer and the opposite electrode comprises a cut surface in the intermediate area.

3. The display apparatus of claim 1, wherein the intermediate layer and the opposite electrode end at the area between the partition wall and the opening area.

4. The display apparatus of claim 3, wherein an end portion of the intermediate layer corresponds to an end portion of the opposite electrode.

5. The display apparatus of claim 1, further comprising a metal residual layer on the inorganic insulating layer and corresponding to the area between the partition wall and the opening area.

6. The display apparatus of claim 5, wherein the first inorganic encapsulation layer is in contact with the metal residual layer in the area between the partition wall and the opening area.

7. The display apparatus of claim 5, wherein the metal residual layer exposes at least a portion of the inorganic insulating layer.

8. The display apparatus of claim 5, wherein the metal residual layer comprises the same material as the pixel electrode.

9. The display apparatus of claim 1, further defining an opening corresponding to the opening area and penetrating the substrate.

10. The display apparatus of claim 1, wherein a pixel circuit layer further comprises a routing wire bypassing the opening area.

11. The display apparatus of claim 1, further comprising a component on one side of the substrate and corresponding to the opening area.

12. A display apparatus comprising:
a substrate defining an opening area and comprising a display area and an intermediate area between the opening area and the display area;
an inorganic insulating layer in the display area and the intermediate area;
a pixel circuit in the display area;
an organic insulating layer on the pixel circuit;
a pixel electrode on the organic insulating layer and electrically connected to the pixel circuit, an intermediate layer on the pixel electrode, and an opposite electrode on the intermediate layer;
a thin-film encapsulation layer on the opposite electrode and comprising a first inorganic encapsulation layer, a second inorganic encapsulation layer, and an organic encapsulation layer between the first inorganic encapsulation layer and the second inorganic encapsulation layer; and
a partition wall on the organic insulating layer in the intermediate area and comprising at least two dams,
wherein the inorganic insulating layer is in contact with the thin-film encapsulation layer in an area between the partition wall and the opening area; and
wherein the partition wall comprises at least three dams with a valley between each of the at least three dams, respectively.

13. The display apparatus of claim 12, wherein each of the at least three dams comprises a first layer on the organic insulating layer and a second layer on the first layer.

14. The display apparatus of claim 13, further comprising:
a pixel-defining layer defining an opening that exposes a portion of the pixel electrode; and
a spacer on the pixel-defining layer,
wherein the first layer comprises the same material as the pixel-defining layer, and
the second layer comprises the same material as the spacer.

15. The display apparatus of claim 13, wherein each valley exposes at least a portion of the organic insulating layer.

16. The display apparatus of claim 13, wherein the at least three dams comprise a first dam closest to the display area, and
the organic insulating layer on a side of the first dam adjacent the display area defines a groove portion.

17. The display apparatus of claim 16, wherein a portion of the organic encapsulation layer is in the groove portion.

18. The display apparatus of claim 16, wherein the at least three dams further comprise a second dam, and
each of the intermediate layer and the opposite electrode is arranged to cover the partition wall and extends to a side surface of the second dam arranged toward a fourth area.

19. A display apparatus comprising:
a substrate defining an opening area and comprising a display area and an intermediate area between the opening area and the display area;
an inorganic insulating layer in the display area and the intermediate area;
a pixel circuit on the inorganic insulating layer in the display area;
an organic insulating layer on the pixel circuit;
a pixel electrode on the organic insulating layer and electrically connected to the pixel circuit, an intermediate layer on the pixel electrode, and an opposite electrode on the intermediate layer;
a thin-film encapsulation layer on the opposite electrode and comprising a first inorganic encapsulation layer, a second inorganic encapsulation layer, and an organic encapsulation layer between the first inorganic encapsulation layer and the second inorganic encapsulation layer;
at least two partition walls on the organic insulating layer in the intermediate area; and
a dam portion on the inorganic insulating layer and in the intermediate area between the partition wall and the opening area; and
wherein each of the intermediate layer and the opposite electrode extends to the intermediate area and covers the partition wall.

20. The display apparatus of claim 19, further comprising a metal residual layer in the intermediate area in an area between the dam portion and the opening area.

21. The display apparatus of claim 20, wherein the first inorganic encapsulation layer is in contact with the metal residual layer in the intermediate area between the dam portion and the opening area.

22. The display apparatus of claim 19, wherein the intermediate layer and the opposite electrode end in the intermediate area in an area between the dam portion and the opening area.

23. The display apparatus of claim 22, wherein each of the intermediate layer and the opposite electrode extends to the dam portion and covers a top surface of the dam portion.

24. A method of manufacturing a display apparatus, the method comprising:
- preparing a substrate defining an opening area and comprising a display area and an intermediate area between the opening area and the display area;
- forming an inorganic insulating layer in the display area and the intermediate area;
- forming a pixel circuit on the inorganic insulating layer in the display area;
- forming an organic insulating layer on the pixel circuit;
- forming a partition wall comprising at least two dams on the organic insulating layer in the intermediate area;
- sequentially forming, on the organic insulating layer, a pixel electrode, an intermediate layer, and an opposite electrode which are electrically connected to the pixel circuit;
- irradiating with a laser the opposite electrode and the intermediate layer in the intermediate area between the opening area and the partition wall; and
- forming, on the opposite electrode, a thin-film encapsulation layer in which a first inorganic encapsulation layer, an organic encapsulation layer, and a second inorganic encapsulation layer are sequentially formed, wherein the first inorganic encapsulation layer is in contact with the inorganic insulating layer in the intermediate area between the opening area and the partition wall; and wherein each of the intermediate layer and the opposite electrode extends to the intermediate area and covers the partition wall.

25. The method of claim 24, further comprising, before irradiating with the laser, forming a metal layer on the inorganic insulating layer in the intermediate area between the opening area and the partition wall.

26. The method of claim 25, wherein irradiating with the laser further comprises removing the intermediate layer and the opposite electrode formed on the metal layer with the laser.

27. The method of claim 25, wherein, after irradiating with the laser, a portion of the metal layer is removed together with the intermediate layer and the opposite electrode, and
- a remaining portion of the metal layer remains as a metal residual layer.

28. The method of claim 27, wherein the metal residual layer exposes a portion of the inorganic insulating layer located therebelow in the intermediate area between the opening area and the partition wall, and the first inorganic encapsulation layer is in contact with the metal residual layer and the portion of the inorganic insulating layer exposed by the metal residual layer.

29. The method of claim 24, wherein, in forming the partition wall, the partition wall comprises at least three dams with a valley between each of the at least three dams, respectively, and
- the first inorganic encapsulation layer is in contact with the second inorganic encapsulation layer on at least one of the at least three dams.

* * * * *